(12) United States Patent
Giustina et al.

(10) Patent No.: US 12,074,003 B2
(45) Date of Patent: Aug. 27, 2024

(54) WIRELESS ACTUATOR UNIT WITH A THERMOSTAT STAND

(71) Applicant: Google LLC, Mountain View, CA (US)

(72) Inventors: Giancarlo Giustina, San Francisco, CA (US); Yu-Cheng Pan, Taipei (TW); Peter Privitera, San Francisco, CA (US); Chang-Wei Wu, Taipei (TW); Aditya Narayanan, Sunnyvale, CA (US); Ssu-Chieh Yu, Taipei (TW); Bhaveya Dhall, San Francisco, CA (US); Jungmin Han, Cupertino, CA (US); Brian Huynh, Mountain View, CA (US); Sung Bai, San Jose, CA (US)

(73) Assignee: Google LLC, Mountain View, CA (US)

( * ) Notice: Subject to any disclaimer, the term of this patent is extended or adjusted under 35 U.S.C. 154(b) by 1015 days.

(21) Appl. No.: 16/975,656

(22) PCT Filed: Jun. 26, 2018

(86) PCT No.: PCT/US2018/039513
§ 371 (c)(1),
(2) Date: Aug. 25, 2020

(87) PCT Pub. No.: WO2020/005210
PCT Pub. Date: Jan. 2, 2020

(65) Prior Publication Data
US 2020/0411256 A1   Dec. 31, 2020

(51) Int. Cl.
*H05K 5/03* (2006.01)
*H01H 13/04* (2006.01)
*H01H 13/14* (2006.01)
*H05K 5/00* (2006.01)
*F24D 19/10* (2006.01)
*F24F 11/52* (2018.01)
*H05K 5/02* (2006.01)

(52) U.S. Cl.
CPC ............ *H01H 13/14* (2013.01); *H01H 13/04* (2013.01); *H05K 5/0004* (2013.01); *H05K 5/03* (2013.01);
(Continued)

(58) Field of Classification Search
None
See application file for complete search history.

(56) References Cited

U.S. PATENT DOCUMENTS 3,541,882 A   11/1970 Testa
3,662,618 A   5/1972 Kroll et al.
(Continued)

FOREIGN PATENT DOCUMENTS

EP   3144783 A1   3/2017
KR   2012-0029534 A   3/2012
WO   2015/148596 A1   10/2015

OTHER PUBLICATIONS

International Preliminary Report on Patentability mailed Dec. 29, 2020 in International Patent Application No. PCT/US2018/039513, 9 pages.
(Continued)

*Primary Examiner* — Courtney L Smith
(74) *Attorney, Agent, or Firm* — Kilpatrick Townsend & Stockton LLP

(57) ABSTRACT

Various arrangements of smart home devices are presented herein. A chassis assembly of a smart home device may define one or more compartments. The chassis assembly may include a plurality of cover fasteners. A rotatable cover assembly may be present and configured to be removably attached with the plurality of cover fasteners to the chassis assembly in any rotational orientation and to at least partially cover a front of the chassis assembly. While the rotatable cover is removably attached with the plurality of (Continued)

cover fasteners, the rotatable cover assembly is configured to block access to the one or more compartments defined by the chassis assembly.

20 Claims, 25 Drawing Sheets

(52) U.S. Cl.
CPC .............. *F24D 19/10* (2013.01); *F24F 11/52* (2018.01); *H01H 2231/012* (2013.01); *H05K 5/0221* (2013.01)

(56) References Cited

U.S. PATENT DOCUMENTS

| | | | | |
|---|---|---|---|---|
| 7,813,111 | B2* | 10/2010 | Anderson | F21V 23/026 361/173 |
| 9,877,580 | B2* | 1/2018 | Stewart, Jr. | A47B 81/00 |
| 10,270,236 | B2* | 4/2019 | Franck | E04F 19/08 |
| 10,356,948 | B2* | 7/2019 | Trygubova | H05K 7/2049 |
| 10,398,049 | B2* | 8/2019 | Ma | A45B 3/02 |
| 10,478,668 | B2* | 11/2019 | Welker | A63B 24/0062 |
| 11,121,527 | B2* | 9/2021 | Miller | H02B 1/30 |
| 11,209,845 | B2* | 12/2021 | Iaconis | H02G 3/12 |
| 2010/0051430 | A1 | 3/2010 | Baller et al. | |
| 2017/0059900 | A1* | 3/2017 | Giustina | G05D 23/1905 |
| 2020/0245730 | A1* | 8/2020 | Grinnell | A44B 17/0076 |

OTHER PUBLICATIONS

International Search Report and Written Opinion mailed May 17, 2019 in International Patent Application No. PCT/US2018/039513, 17 pages.

Office Action for EP 18 743 177 dated Aug. 8, 2022, all pages.

* cited by examiner

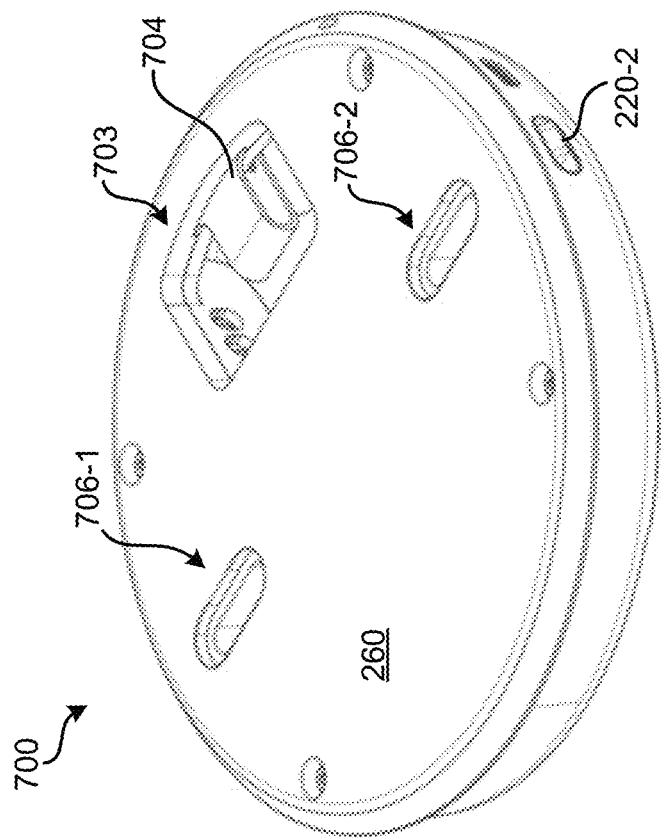
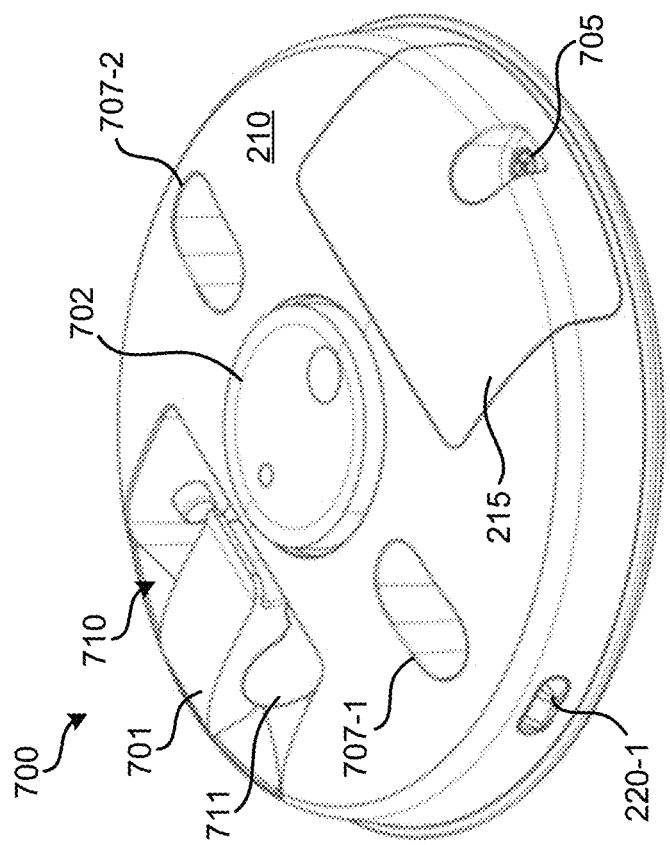
FIG. 7A
FIG. 7B

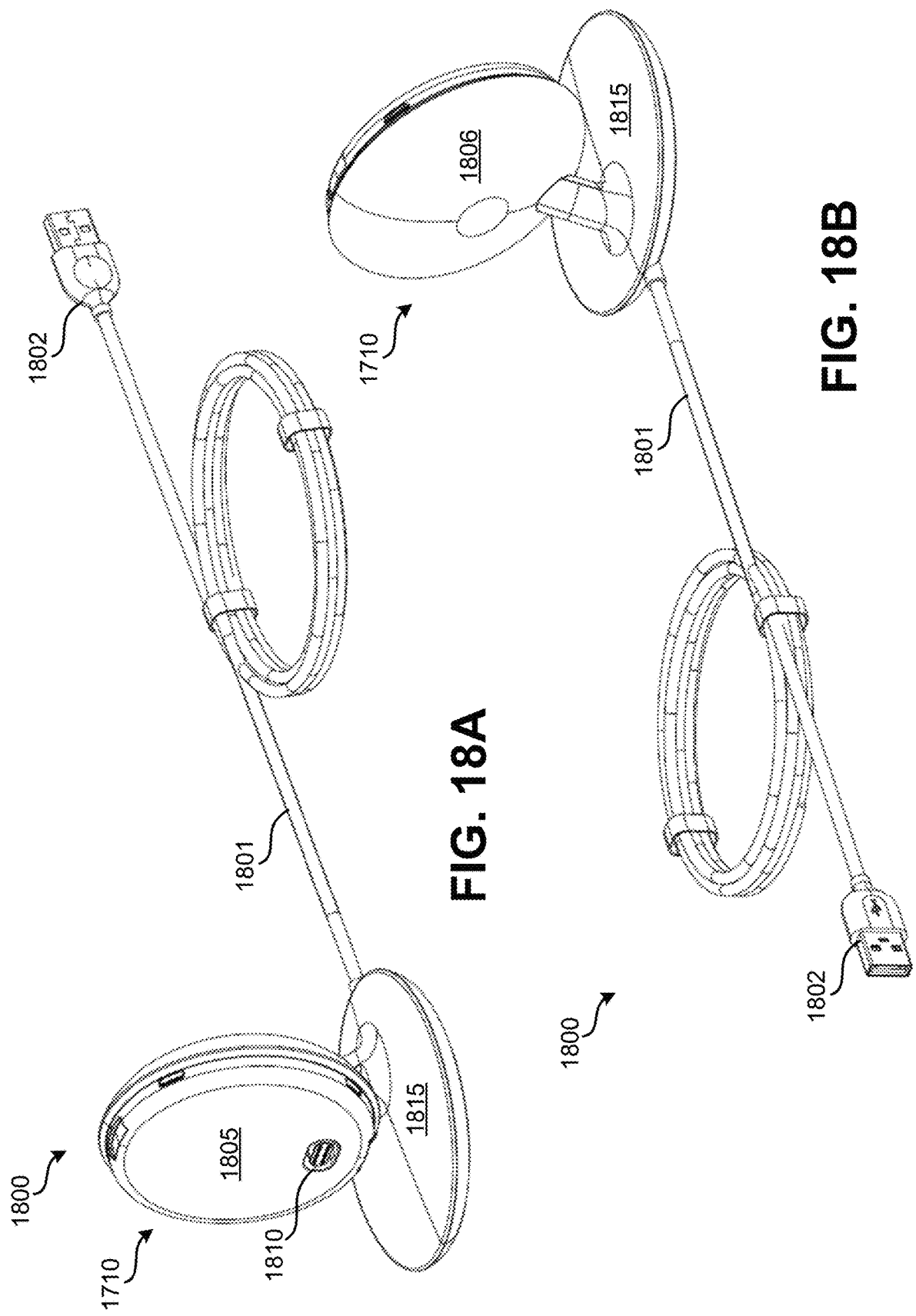

WIRELESS ACTUATOR UNIT WITH A THERMOSTAT STAND

CROSS REFERENCES TO RELATED APPLICATIONS

This application is a National Stage Application of International Application No. PCT/US2018/039513 filed Jun. 26, 2018. This Application is related to U.S. Pat. No. 9,568,201, entitled "Environmental Control System Retrofittable with Multiple Types of Boiler-Based Heating Systems," which is hereby incorporated by reference for all purposes.

BACKGROUND

In certain situations, it may be beneficial to have a thermostat located a distance away from a location at which connection to heating, ventilation, and air conditioning (HVAC) control wires are accessible. For instance, HVAC control wires may be run from an HVAC system, behind a wall, and exposed in an inconvenient location, such as within a utility closet. Such a location may not be convenient to be accessed by a user or such a location may not be ideal for accurately sensing the temperature of a region of the structure in which occupants are typically present.

SUMMARY

Various embodiments are described related to a smart home device. In some embodiments, a smart home device is described. The device may include a chassis assembly that defines one or more compartments and the chassis assembly may include a plurality of cover fasteners. The device may include a rotatable cover assembly configured to be removably attached with the plurality of cover fasteners to the chassis assembly to at least partially cover a front of the chassis assembly. The rotatable cover assembly may be configured to be attached and removed from the chassis assembly in any rotational orientation. While the rotatable cover assembly may be removably attached with the plurality of cover fasteners, the rotatable cover assembly may be configured to block access to the one or more compartments defined by the chassis assembly.

Embodiments of such a device may include one or more of the following features: While the rotatable cover assembly may be removably attached with the plurality of cover fasteners, the rotatable cover assembly may be configured to be rotatable with respect to the chassis assembly. The rotatable cover assembly may include a cover body. A front surface of the cover body may include a plurality of protrusions. The rotatable cover assembly may further include a fabric that covers the front surface of the cover body that may include the plurality of protrusions. A front of the rotatable cover assembly may have a visible pattern. The front of the rotatable cover assembly that has the visible pattern may include a fabric. The rotatable cover assembly may be circular. The rotatable cover assembly may be continuously rotatable in a clockwise and counterclockwise direction with non-indexed movement. The chassis assembly may include a display that may be visible through a defined opening in the rotatable cover assembly while the rotatable cover assembly may be removably attached with the plurality of cover fasteners. The display may be a dead front display. The chassis assembly may include a button that may be accessible through a defined opening in the rotatable cover assembly while the rotatable cover assembly may be removably attached with the plurality of cover fasteners. The smart home device may be an actuator device that may be configured to be connected with a plurality of heating, ventilation, and air conditioning control wires via terminals present in a compartment of the one or more compartments.

In some embodiments, a boiler control system is described. The boiler control system may include an actuator device that may be connected with a boiler via one or more control wires. The device may include a chassis assembly that defines one or more compartments and the chassis assembly may include a plurality of cover fasteners. The device may include a rotatable cover assembly configured to be removably attached with the plurality of cover fasteners to the chassis assembly to at least partially cover a front of the chassis assembly. The rotatable cover assembly may be configured to be attached and removed from the chassis assembly in any rotational orientation. While the rotatable cover assembly may be removably attached with the plurality of cover fasteners, the rotatable cover assembly may be configured to block access to the one or more compartments defined by the chassis assembly. The system may include a thermostat stand device that provides power to a thermostat that may wirelessly communicate with the actuator device.

Embodiments of such a method may include one or more of the following features: While the rotatable cover assembly may be removably attached with the plurality of cover fasteners, the rotatable cover assembly may be configured to be rotatable with respect to the chassis assembly. The rotatable cover assembly may include a cover body. A front surface of the cover body may include a plurality of protrusions. The rotatable cover assembly may further include a fabric that covers the front surface of the cover body that may include the plurality of protrusions. A front of the rotatable cover assembly may have a visible pattern. The front of the rotatable cover assembly that has the visible pattern may include a fabric. The rotatable cover assembly may be continuously rotatable in a clockwise and counterclockwise direction with non-indexed movement. The chassis assembly may include a display that may be visible through a defined opening in the rotatable cover assembly while the rotatable cover assembly may be removably attached with the plurality of cover fasteners.

BRIEF DESCRIPTION OF THE DRAWINGS

A further understanding of the nature and advantages of various embodiments may be realized by reference to the following figures. In the appended figures, similar components or features may have the same reference label. Further, various components of the same type may be distinguished by following the reference label by a dash and a second label that distinguishes among the similar components. If only the first reference label is used in the specification, the description is applicable to any one of the similar components having the same first reference label irrespective of the second reference label.

FIG. 7A illustrates a front view of an embodiment of a chassis assembly.

FIG. 7B illustrates a back view of an embodiment of a chassis assembly.

FIG. 18A illustrates a front view of an embodiment of a stand device connected with a power cable.

FIG. 18B illustrates a back view of an embodiment of a stand device connected with a power cable.

DETAILED DESCRIPTION

Figure 1:
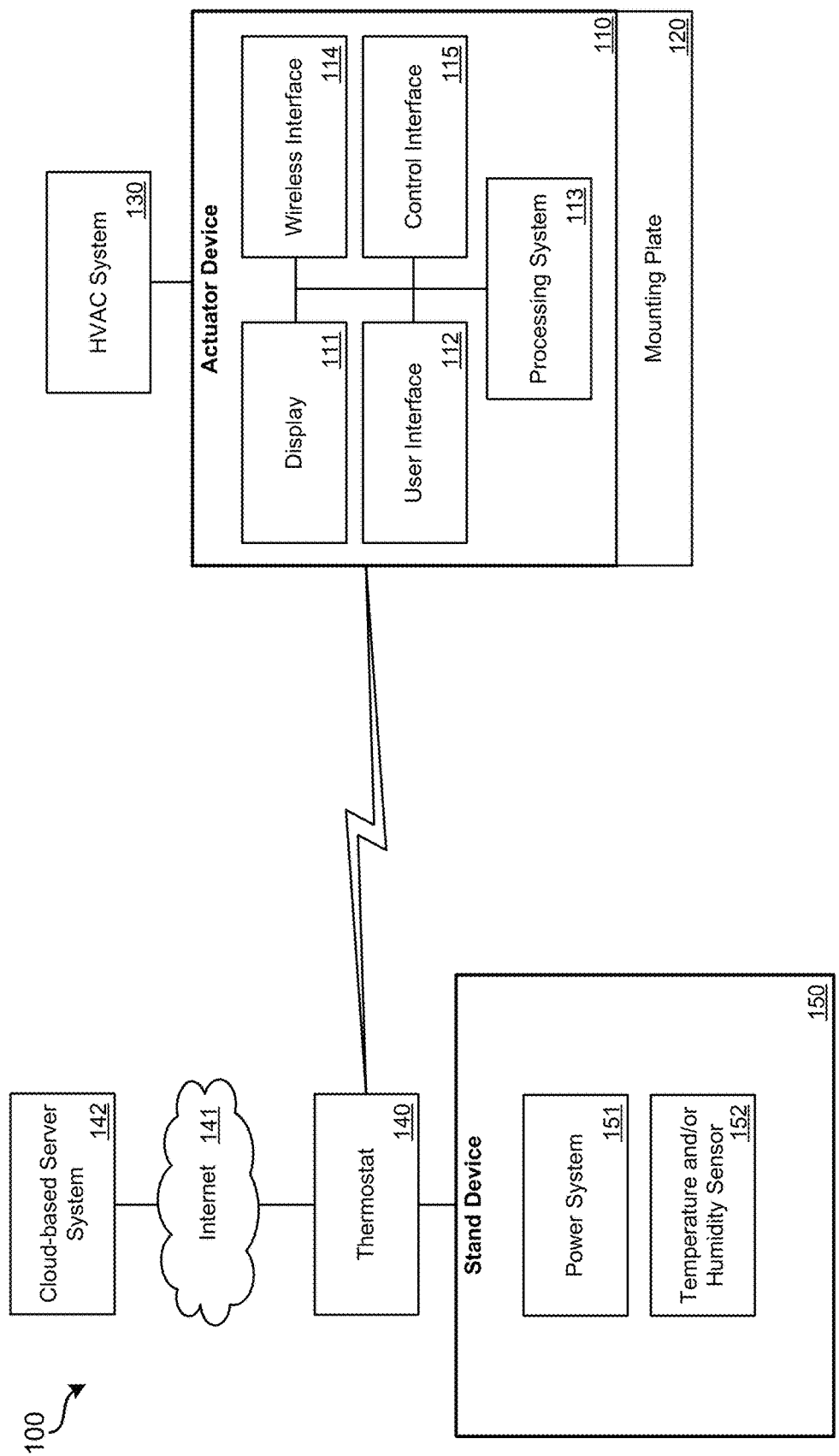
FIG. 1 illustrates an embodiment of a block diagram of an HVAC control system that includes a stand device and an actuator device.

An actuator device (also referred to as an "actuator") may be connected with control wires. Such control wires may control operation of various components, such as: a furnace; a boiler; a fan; an air conditioner; and/or a multi-stage heating or cooling system. The actuator may open and close circuits in order to control operation of components of the HVAC system. Due to the actuator being directly connected with control wires, the actuator may be located in a hidden, concealed, or inconvenient location, such as in a utility closet, where the HVAC control wires are exposed. A user may have a thermostat and a movable stand device (also referred to as a "stand") that can be connected to a power source near a location where the user desires the thermostat to be located. The user may typically have the thermostat located in a convenient location in a room frequently used by occupants of the structure. The stand is configured to connect with a thermostat and provide the thermostat with power and, possibly, temperature measurements. The thermostat wirelessly communicates with the actuator device in order to control the components of the HVAC system. Thus, the actuator can be directly connected to the control wires and the thermostat can be conveniently located to ensure that the temperature of a desired location is monitored accurately and to enable a user to easily access controls to control the HVAC. The thermostat may receive and implement temperature set-points provided by a user. The thermostat may further learn and/or receive a setpoint schedule to be implemented daily or on certain days of the week. The thermostat may communicate with a remote cloud-based server to provide users with various services via end-user computerized devices, such as a smartphone, desktop, or tablet computer. Although the above has referred to an actuator for use in a HVAC system, this aspect and the other features described herein are not limited to HVAC systems and may be applied to other control systems that may be installed in a home, office, or other location, such as a door entry system, an alarm system, an irrigation system or other similar control systems. Generally the actuator device is configured to control functions of the control system and may be located where the control wires for the control system are exposed. In an example arrangement, the system may additional comprises a remote device, such as a remote control device or a remote sensor or a remote input device, which remote device may include a door bell, camera, temperature sensor, smoke detector, carbon monoxide detectors, home assistants or other similar devices may located in a convenient location (e.g. in a room, within a building, outside of a building, on an entry way) and may wirelessly communicate with the actuator device in order to control the components of the control system. In some implementations, the remote device may be connected to a stand which is configured to provide power to the remote device. Thus, the actuator can be directly connected to the control wires whilst the remote device can be conveniently located to enable a user to easily access controls to control the control system via the actuator.

Embodiments detailed herein are focused on various aspects of the actuator and stand. Such aspects can improve the functionality, aesthetics, sizing characteristics (e.g., allow the device to be thinner or smaller), and/or manufacturability of the actuator and/or the stand. It is to be appreciated that while one or more embodiments are described further herein in the context of a typical HVAC system used in a residential home, such as a single-family residential home, the scope of the present teachings is not so limited. More generally, intelligent thermostat systems according to one or more of the embodiments are applicable for a wide variety of enclosures having one or more HVAC systems including, without limitation, duplexes, townhomes, multi-unit apartment buildings, hotels, retail stores, office buildings, and industrial buildings. Further, it is to be appreciated that while the terms user, customer, installer, homeowner, occupant, guest, tenant, landlord, repair person, and/or the like may be used to refer to the person or persons who are interacting with the thermostat or other device or user interface in the context of one or more scenarios described herein, these references are by no means to be considered as limiting the scope of the present teachings with respect to the person or persons who are performing such actions.

It is to be appreciated that "smart home environments" may refer to smart environments for homes such as a single-family house, but the scope of the present teachings is not so limited, the present teachings being likewise applicable, without limitation, to duplexes, townhomes, multi-unit apartment buildings, hotels, retail stores, office buildings, industrial buildings, and more generally any living space or work space having one or more smart hazard detectors.

While embodiments detailed herein are focused on actuators or thermostats connected to stands, it should be understood that the embodiments detailed herein may be applicable to other smart home devices and/or sensor devices. For instance, aspects of the detailed actuators and/or stands may be applied to thermostats, smoke detectors, carbon monoxide detectors, doorbells, home assistants, video cameras, remote temperature sensors, or other smart home devices that may be installed in a home, office, or other location. A smart home device is a device operable as a control device and/or a sensor device and/or a user input device. Thus, the smart home device may be an actuator as discussed herein or a thermostat as discussed herein. The smart home device may also include, smoke detectors, carbon monoxide detectors, doorbells, home assistants, video cameras, remote temperature sensors, or other similar devices.

FIG. 1 illustrates an embodiment of a block diagram of an HVAC control system 100 that includes a stand and an actuator. Embodiments detailed in this document can represent components of HVAC control system 100. However, as discussed above, one or more of the features described herein may be implemented in other control systems and it is not intended to limit the features described below only to HVAC control systems. HVAC control system 100 may include: actuator device 110; mounting plate 120; HVAC system 130; thermostat 140; and stand device 150. Actuator device 110 may be attached to a mounting plate 120. Mounting plate 120 may facilitate actuator device 110 being attached to a surface (e.g., a wall) and allowing HVAC control wires to be routed into a back of actuator device 110. For instance, HVAC control wires may be mounted on a surface of a wall. Mounting plate 120 may allow actuator device 110 to be secured to the surface of the wall while allowing HVAC control wires to be passed through a rear surface of actuator device 110. Actuator device 110 may be connected via multiple HVAC control wires to HVAC system 130.

Actuator device 110 may include: display 111, user interface 112, processing system 113, wireless interface 114, and control interface 115. Display 111, which may include one or more LEDs or other forms of lighting elements, may present information to a user. Display 111 may include a "dead front" display. A "dead front" display is a display that appears to have a blank display surface (e.g. that is difficult to identify as a display) when the one or more lighting elements are inactive. When active, the lighting elements light the display to make one or more images, such as symbols, text, particular region on the display, visible to the user on the display surface. User interface 112 may include one or more buttons or other forms of user input devices that allow a user to provide input directly to actuator device 110. For instance, user interface 112 may be used to engage one or more components of HVAC system 130 without a user needing to interact with thermostat 140. Processing system 113 may include one or more processors that receive and send information via wireless interface 114 to thermostat 140. Processing system 113 may receive input from user interface 112, output information that is presented via display 111, and control actuation of HVAC components via control interface 115. Wireless interface 114 may use one or more wireless communication protocols, such as: Wi-Fi® (IEEE 802.11), IEEE 802.15.4, Bluetooth®, Z-Wave®, ZigBee®, Thread®, or some other wireless communication protocol to communicate with thermostat 140. Control interface 115 may open and close circuits that include HVAC control wires based on instructions from processing system 113 to control HVAC system 130.

Thermostat 140 may wirelessly communicate with actuator device 110. Thermostat 140 may transmit instructions, such as via the use of one of the previously-detailed wireless communication protocols, to instruct actuator device 110 to activate or deactivate one or more components of HVAC system 130. Thermostat 140 may be removably coupled with stand device 150. Thermostat 140 may communicate via a wireless network (e.g., a Wi-Fi WLAN) with Internet 141. Via Internet 141, thermostat 140 may transmit data to and receive data from cloud-based server system 142. Cloud-based server system 142 may maintain a user account that stores data related to thermostat 140 and may permit a user to remotely control and/or view data related to thermostat 140. For example, a user may communicate with cloud-based server system 142 to modify a setpoint schedule implemented by thermostat 140 or may provide a real time setpoint that is used to immediately control HVAC system 130 by thermostat 140 (via actuator device 110).

Stand device 150 may be placed on a surface and may have a power system 151 that powers thermostat 140. Power system 151 may be connected with a power outlet (e.g., 120 V, 230 V) and may output a constant voltage to thermostat 140. Stand device 150 may have one or more on-board sensors, such as temperature and/or humidity sensor 152, that provides temperature and/or humidity measurements to thermostat 140.

Figure 2:
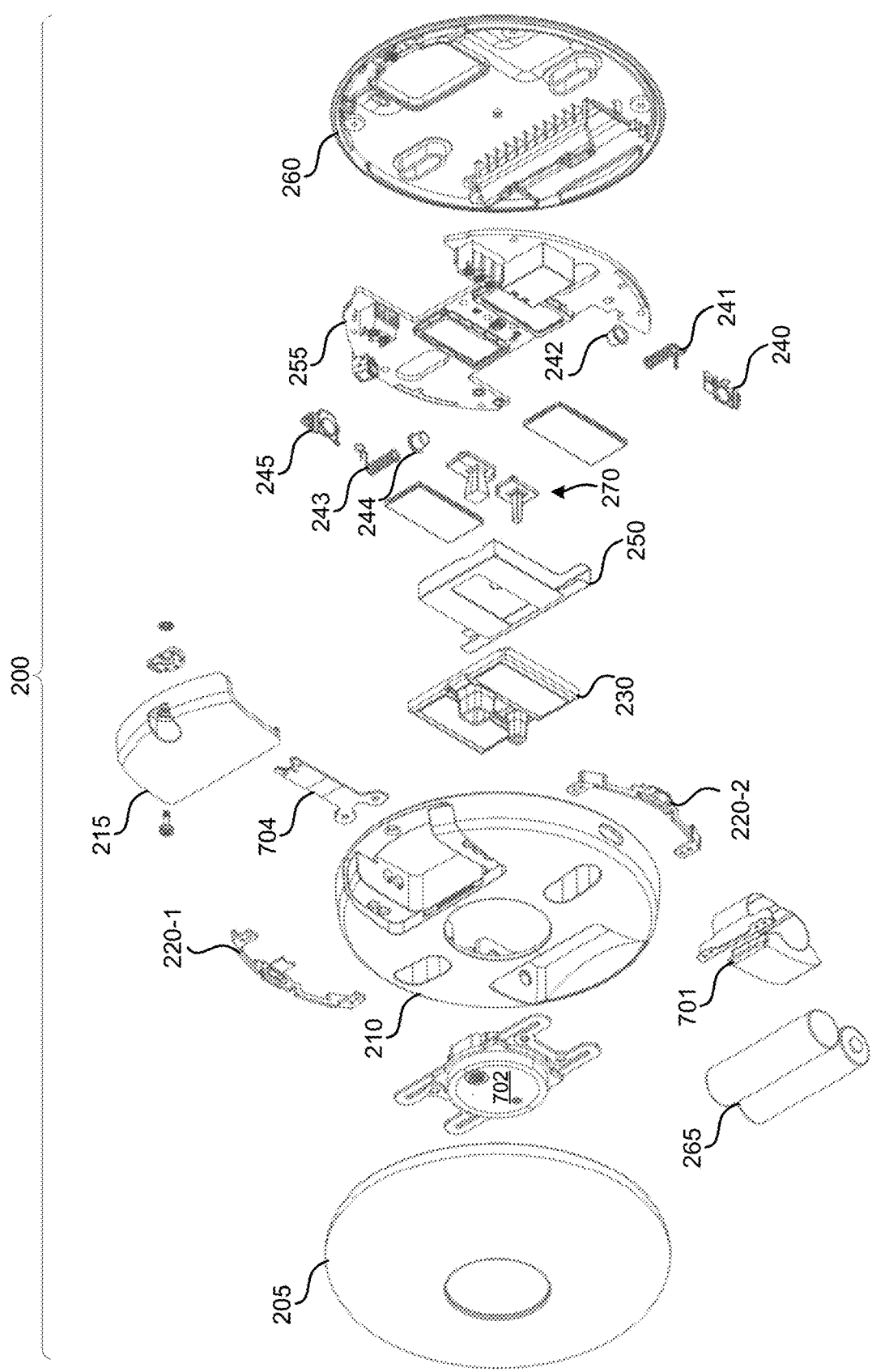
FIG. 2 illustrates an exploded front view of an embodiment of an actuator device.

Further details regarding actuator device 110, mounting plate 120, and stand device 150 are provided in relation to FIGS. 2-22. FIG. 2 illustrates an exploded view of a top of an actuator 200. Actuator 200 can represent an embodiment of actuator device 110 of FIG. 1. The following describes an actuator for controlling a HVAC system but, as discussed above, it is not intended to limit the features described herein only to an actuator for a HVAC control system. It will be appreciated that one or more features described herein may be used in actuators for controlling other control systems or in other smart home devices. In the following, the smart home device comprises actuator 200 which comprises a chassis assembly that defines one or more compartments and which comprises a plurality of cover fasteners. The actuator 200 further comprises a rotatable cover assembly configured to be removably attached with the plurality of cover fasteners to the chassis assembly to at least partially cover a front of the chassis assembly. While the rotatable cover assembly is removably attached with the plurality of cover fasteners, the rotatable cover assembly is configured to be rotatable with respect to the chassis assembly and while the rotatable cover is removably attached with the plurality of cover fasteners, the rotatable cover assembly is configured to block access to the one or more compartments defined by the chassis assembly. The one or more compartments of the chassis assembly are configured to support components of the actuator 200. The components of the actuator 200 may include one or more of: chassis 210; display (not shown in FIG. 2); wiring connector cover 215; cover fastener assemblies or fasteners 220 (220-1, 220-2) (hereinafter referred to as cover fastener assemblies) for removably attaching the rotatable cover assembly 205 to the chassis assembly; light boot assembly 230; battery contact 240; battery spring 241, spring cap 242; battery spring 243; spring cap 244, battery contact 245; support 250; printed circuit board (PCB) 255; backplate 260; batteries 265; light pipe assembly 270 (which can include multiple light pipes and the structure to which the light pipes are attached); battery holder tab 701; button 702; and cover leash 704. Rotatable cover assembly 205 is designed to be facing away from a surface to which backplate 260 is mounted. As such, rotatable cover assembly 205, when removably attached with chassis 210 of chassis assembly, may be the component of actuator 200 most visible to a user. Rotatable cover assembly 205 may be removable by a user, such as by pulling edges of rotatable cover assembly 205 to release the rotatable cover assembly from the plurality of cover fastener assemblies. Removing rotatable cover assembly 205 can allow a user to access wiring connectors and/or a battery compartment of chassis 210. In other words, with the rotatable cover assembly being removably attached to the chassis assembly, a user can easily access the compartments of the chassis assembly to enable a user to more easily install the smart home device (e.g. make the wiring connections to the device), replace batteries and/or check and/or fix wiring connections once the smart home device has been installed. Further, by rotatable cover assembly 205 being rotatable, a user can rotate rotatable cover assembly 205 to a desired orientation, which may be desirable for aesthetic reasons. PCB 255 may have components such as a wireless interface (e.g., wireless interface 114) and processing system (e.g., processing system 113) mounted to it.

Figure 3:
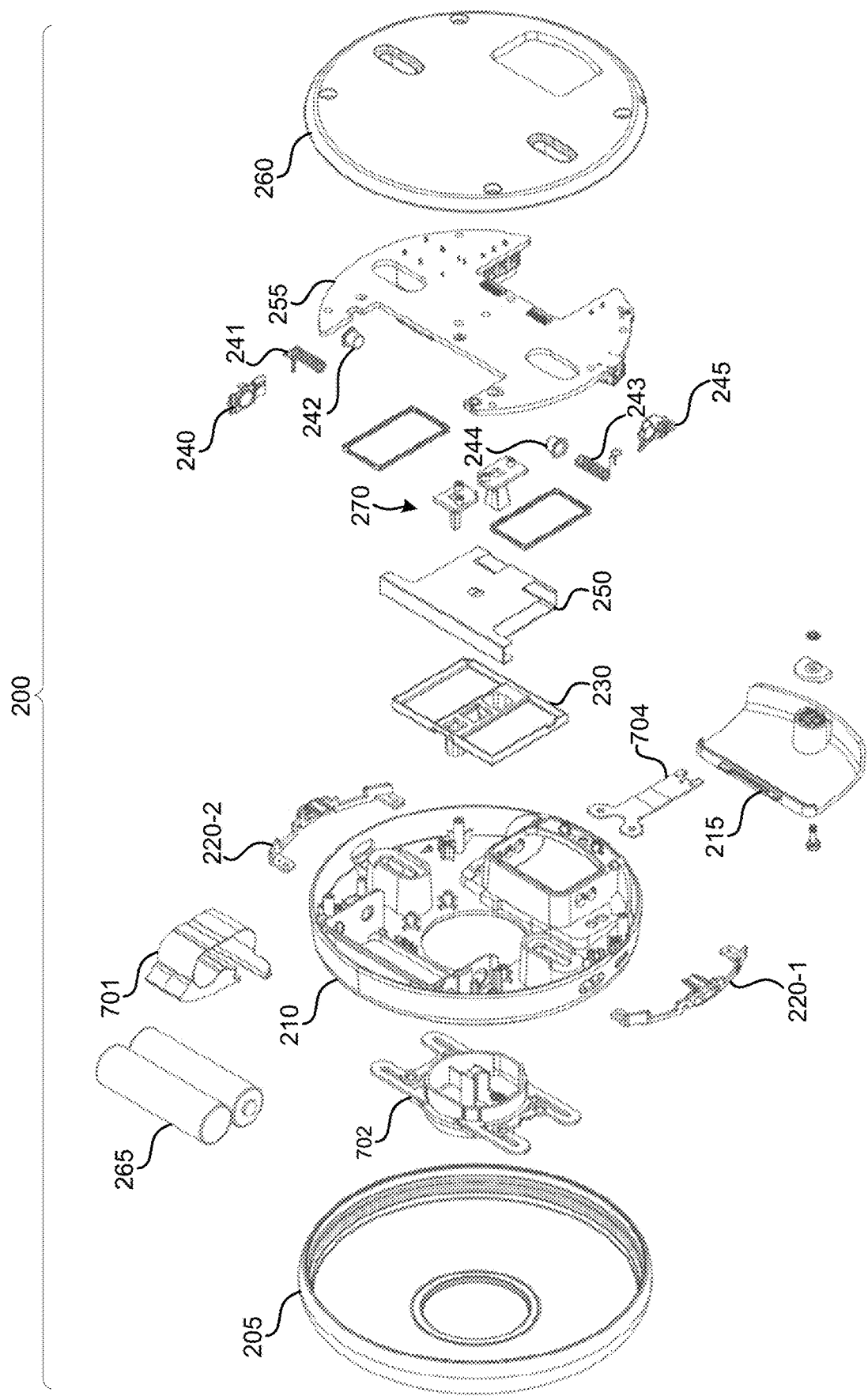
FIG. 3 illustrates an exploded back view of an embodiment of an actuator device.

FIG. 3 illustrates an exploded view of a bottom of actuator 200. FIG. 3 illustrates a back side of each component of actuator 200 as compared to the front side illustrated in FIG. 2.

Figure 4A:
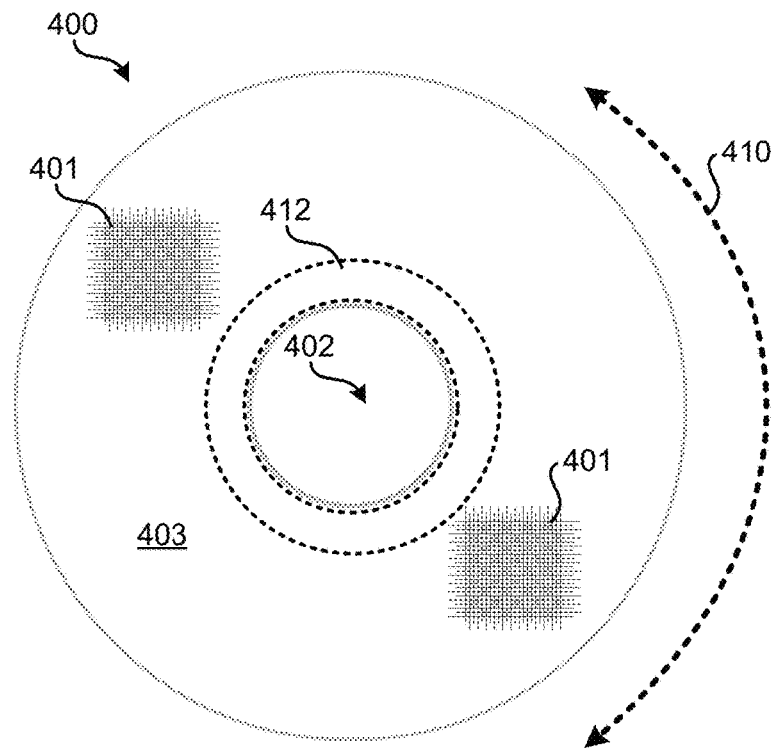
FIG. 4A illustrates a front view of an embodiment of a rotatable cover assembly.
Figure 4B:
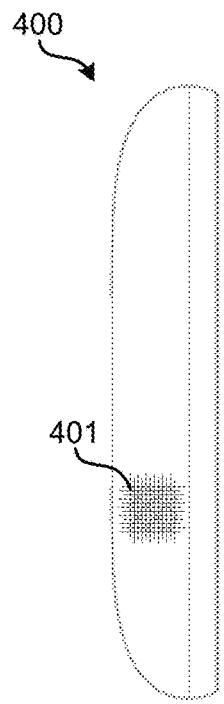
FIG. 4B illustrates a side view of an embodiment of a rotatable cover assembly.
Figure 4C:
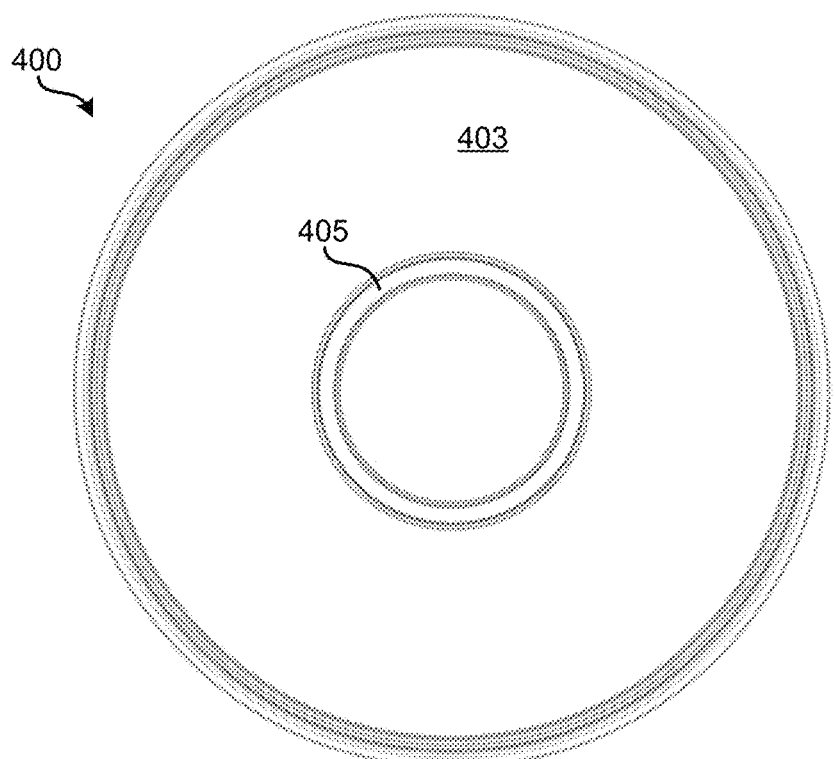
FIG. 4C illustrates a back view of an embodiment of a rotatable cover assembly.

FIG. 4A illustrates a front view of an embodiment of a rotatable cover assembly 400. FIG. 4B illustrates a side view of an embodiment of the rotatable cover assembly 400. FIG. 4C illustrates a back view of an embodiment of a rotatable cover assembly 400. Rotatable cover assembly 400 can represent an embodiment of rotatable cover assembly 205. Rotatable cover assembly comprises a cover body 403. The rotatable cover assembly 400 may be circular. FIG. 4A, which represents a top or front surface of rotatable cover assembly 400 (e.g. front surface of cover body 403), may be fully or partially covered in a fabric, cloth, or screening. For instance, a knit fabric may be used as an outer layer of rotatable cover assembly 400. It should be understood that this fabric or screening pattern may be stretched over the entirety of the front or top surface illustrated in FIG. 4A. Fabric 401, which may cover an entire front surface of rotatable cover assembly 400, can have a visible pattern or texture. This visible pattern or texture may be more aesthetically pleasing to persons if aligned in a particular orientation. For example, if the visible pattern exhibits a series of parallel lines or a grid, a person my desire to have these lines or the grid aligned either parallel or perpendicular to features of a region in which actuator 200 is installed. For example, such lines or a grid may be desired to be parallel to a joint where walls meet, the ceiling meets a wall, or a wall meets the floor. Further, the fabric allows for a user to easily grip the rotatable cover assembly 400 and remove rotatable cover assembly 400 for access to internal components. Fabric 401 may exhibit an amount of stretch, allowing it to be stretched over a front surface of rotatable cover assembly 400. Fabric 401 may be made of natural, synthetic, or a blend of natural and synthetic fibers. Fabric 401 may be treated in order to change or improve various characteristics of fabric 401. For instance, fabric 401 may be treated with an anti-mold compound to discourage the growth of mold on fabric 401, especially if the actuator is installed in a moist environment. In other embodiments, rather than a fabric being used, some other material may be used as a front or top surface of rotatable cover assembly 400, such as a metallic or plastic screening.

Due to fabric 401 having a visible pattern and/or texture, when rotatable cover assembly 400 is installed on an actuator, it may be desirable for aesthetics for rotatable cover assembly 400 to be in a particular alignment—for example, such that the pattern of fabric 401 is parallel or perpendicular to a nearby floor, wall, and/or ceiling. Rotatable cover assembly 400 may be infinitely rotatable in a clockwise and counterclockwise rotation, such as illustrated by arrow 410. Rotatable cover assembly 400 may have no indexed locations, around chassis 210. After rotatable cover assembly 400 has been removably coupled with chassis 210, a user may rotate rotatable cover assembly 400 either clockwise or counterclockwise to a desired orientation. Once released, friction between rotatable cover assembly 400 and cover fastener assemblies 220 may hold rotatable cover assembly in the desired orientation.

In a center of rotatable cover assembly 400, an open region 402 may be defined. When attached with chassis 210 of chassis assembly, a display and/or button supported in the chassis assembly may be visible and/or accessible through the open region 402. Thus, the rotatable cover assembly 400 may cover a front of the chassis assembly except for an area of the chassis assembly corresponding to the open region 402. Fabric 401 may extend along a curvature of rotatable cover assembly 400 onto each side of rotatable cover assembly 400, as illustrated in FIG. 4B. Each side of rotatable cover assembly 400 may match the representation of FIG. 4B.

In FIG. 4C, a bottom of rotatable cover assembly 400 is illustrated. A bottom surface of cover body 403 may not be covered with fabric or screening and may instead be exposed plastic. Cover body 403 is rigid or semi-rigid such that fabric 401 conforms to an outer surface of cover body 403. Inner ring 405 may be used to fasten fabric 401 as part of rotatable cover assembly 400 in a stretched state. In some embodiments, fabric 401 may be glued or otherwise affixed to cover body 403. In such embodiments, one or more rings (e.g., inner ring 405) may be a stick-on label that serves to hide an edge of fabric 401 from viewing by a user. The use of such a ring may be primarily for aesthetic reasons. At least some elasticity may be incorporated as part of fabric 401 such that if fabric 401 is stretched or otherwise displaced by a user, fabric 401 will return to its original position when released. Inner ring 405 may be attached to cover body 403 and may secure fabric 401 to cover body 403 such that edges of fabric 401 are concealed. In some embodiments, an outer ring may be present. In other embodiments, fabric 401 may be affixed, such as using glue, directly to cover body 403 around an inner edge of cover body 403. Also alternatively, rather than inner ring 405 being present, fabric 401 may be affixed, such as by using glue directly, to cover body 403 around an edge of cover body 403 present on a bottom surface of cover body 403 where inner ring 405 is illustrated as being present.

Referring back to FIG. 4A, beneath fabric 401, an adhesive may be present, such as in region 412, to affix fabric 401 to a front surface of cover body 403. The adhesive used may be a pressure sensitive adhesive (PSA) that may be applied in the form of a doubled-sided pressure-sensitive tape. However, despite being a PSA, the PSA may be heated when applied between the front surface of cover body 403 and fabric 401. By heating the PSA, certain properties typical to a heat sensitive adhesive (HSA) may be realized. For example, some of the PSA may be wicked a distance into the knit of the fabric due to a capillary effect. Such wicking may result in better adhesion between fabric 401 and a front surface of cover body 403. While in some embodiments ring-shaped region 412 is where the PSA is applied and heated, it should be understood that in other embodiments, the PSA may be applied and heated in other or multiple locations. For instance, the PSA may be applied and heated under inner ring 405 on a back surface of cover body 403.

Figure 5:
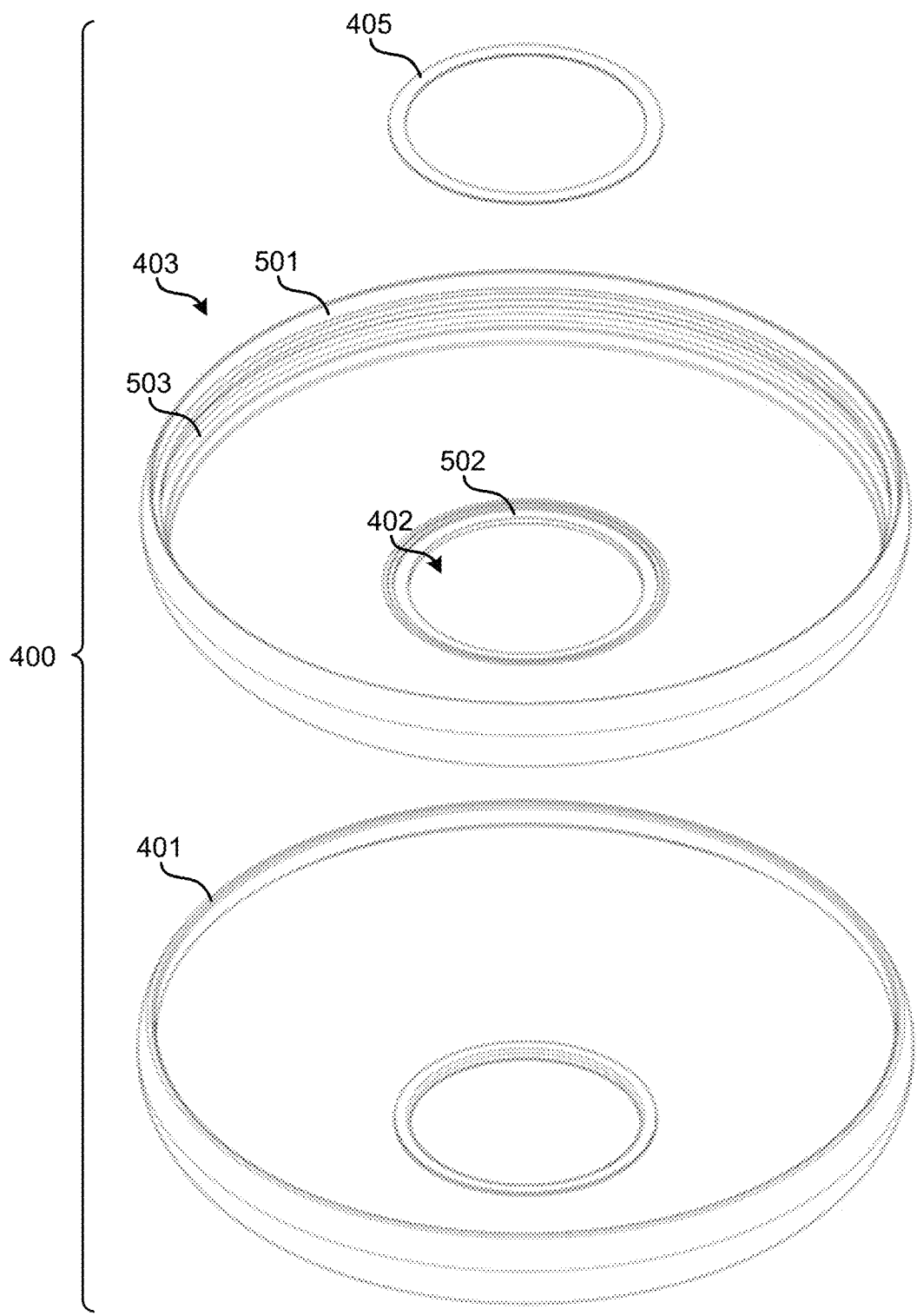
FIG. 5 illustrates an exploded back view of an embodiment of a rotatable cover assembly.

FIG. 5 illustrates an exploded bottom view of rotatable cover assembly 400. In some embodiments, inner ring 405 may be present, but not an outer ring. Rotatable cover assembly 400 may include: inner ring 405; cover body 403; and fabric 401. Fabric 401 may obtain the shape illustrated in FIG. 5 by being stretched over a top or front surface of cover body 403. Fabric 401 may be fastened or affixed (e.g., glued) to inner edge 501. After being fastened or affixed to inner edge 501, fabric 401 may be trimmed along the fastened or affixed edge such that a roughly even edge with minimal or limited fraying is present. Fabric 401 may further be stretched through open region 402 and fastened to inner ring surface 502. Inner ring 405 may be fastened or affixed (e.g., glued) to inner ring surface 502 such that an edge of fabric 401 is secured by inner ring 405 to inner ring surface 502 and hidden from view.

Present on an inner surface of cover body 403 may be circular track 503. Circular track 503 may define at least two lips that continuously extend along an inner surface of cover body 403 and may interface with cover fastener assemblies 220. Cover fastener assemblies 220 may each include a protrusion that slides within the lips of circular track 503. The protrusions of the cover fastener assemblies and the lips of the circular track 503 are configured to co-operate so as to allow rotatable cover assembly 400 to be pushed onto chassis assembly 700 in any rotational orientation in which circular track 503 is coaxial with the chassis assembly. As such, a user, when desiring to attach rotatable cover assembly 400 to the chassis assembly does not need to attempt to align protrusions of the cover fastener assemblies with any particular part of circular track 503. Further, the protrusions of the cover fastener assemblies and the lips of the circular track 503 are configured to co-operate so as to facilitate the rotation of the rotatable cover assembly with respect to the chassis assembly when the rotatable cover assembly is attached to the chassis assembly whilst enabling easy removal by a user of the rotatable cover assembly from the chassis assembly regardless of the rotational orientation of rotatable cover assembly 400 with respect to chassis assembly 700. Friction can be present between cover fastener assemblies 220 and circular track 503 such that when a user is not twisting rotatable cover assembly 400 with respect to chassis 210, rotatable cover assembly 400 orientation remains static.

Figure 6:
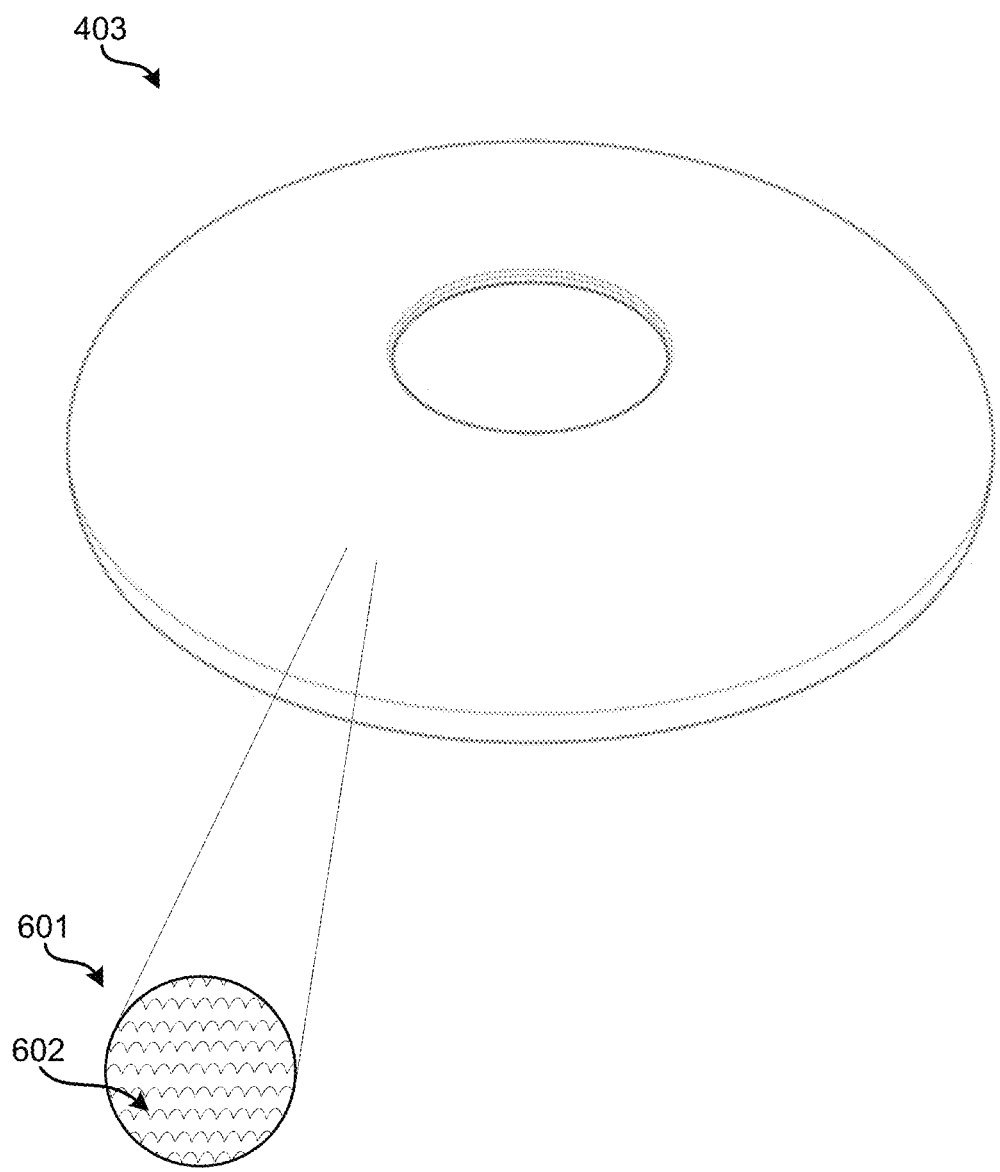
FIG. 6 illustrates a front view of an embodiment of a cover body.

FIG. 6 illustrates an embodiment of cover body 403. Cover body 403 may be formed or made from a rigid or semi-rigid material, such as plastic or metal. In some embodiments, cover body 403 is injection molded. A top surface of cover body 403 may have a texture, such as indicated by raised protrusions 602 in magnified region 601. In some embodiments, raised protrusions 602 are rectangular pyramids, triangular pyramids, or some other raised pyramidal structure. In some embodiments, raised protrusions 602 may be randomly chemically etched. Raised protrusions 602 may cover an outer or top surface of cover body 403. Raised protrusions 602 may serve multiple purposes. When fabric 401 is stretched and wrapped over the top surface of cover body 403, raised protrusions 602 may provide friction and help keep fabric 401 in place. For instance, if a user applies lateral pressure to fabric 401 while fabric 401 is wrapped over the top surface of cover body 403, raised protrusions 602 may help prevent fabric 401 from further stretching and/or bunching. Additionally or alternatively, raised protrusions may increase or otherwise alter the textural feel of fabric 401 when fabric 401 is stretched and wrapped over the top surface of cover body 403.

Raised protrusions 602 represent one possible embodiment of a texture that may be present on a top or front surface of cover body 403. In other embodiments, various forms of texture may be formed as part of the top or front surface of cover body 403 that: 1) help hold fabric 401 in place over a top or front surface of cover body 403; and/or 2) alter the textural feel of fabric 401 when wrapped over the top or front surface of cover body 403. On a bottom or back side of cover body 403, raised protrusions 602 may not be present and the bottom or back surface may be smooth.

FIG. 7A illustrates a top (or front) view of an embodiment of chassis assembly 700. FIG. 7B illustrates a bottom (or back) view of an embodiment of chassis assembly 700. The following describes a chassis assembly of an actuator for controlling a HVAC system but, as discussed above, it is not intended to limit the features described herein only to an actuator for a HVAC control system. It will be appreciated that one or more features described herein may be used in a chassis assembly of an actuator for controlling other control systems or of another smart home device. Chassis assembly 700 may include chassis 210, wiring connector cover 215, cover fastener assemblies 220, button 702, and backplate 260. wiring connector cover 215 may be a leashed cover. When rotatable cover assembly 400 is removed from chassis 210, battery compartment 710 and wiring connector cover 215 may be visible and accessible. When unfastened (e.g., when screw 705 is unscrewed), wiring connector cover 215 may be hung in an open position via cover leash 704. This may allow a user to access terminals present within an wiring compartment to allow control wires, such as HVAC control wires, to be attached and detached. Control wires may be routed through rear opening 703 into the wiring compartment that is covered from a front by wiring connector cover 215. By virtue of cover leash 704 being used to permanently secure wiring connector cover 215 to chassis 210, the loss of wiring connector cover 215 may be prevented. Button 702 may function as both a display and a user-pressable button that allows direct control of a control system, such as a HVAC system, at actuator 200 by a user. For instance, a user may press button 702 to manually activate one or more HVAC systems (e.g., a boiler).

A protruding slider of cover fastener assemblies 220 may protrude through chassis 210. Cover fastener assemblies 220 may be fastened to chassis 210 and may be made of a semi rigid material that can flex inward when pressure is applied to a protruding slider of each cover fastener assembly.

Pressure applied to a protruding slider of cover fastener assemblies 220 may cause the protruding slider to at least partially retract to within chassis 210. Each protruding slider may be tapered on a top and bottom side to allow the slider to retract when rotatable cover assembly 205 is pushed onto or pulled off of chassis assembly 700. The protruding sliders of cover fastener assemblies 220 may rest in a fully or partially extended state within circular track 503 of cover body 403 when rotatable cover assembly 400 is attached with chassis 210. The protruding sliders of cover fastener assemblies 220 can allow for rotatable cover assembly 400 to be rotated and oriented into any desirable orientation, such that a texture or grain of fabric 401 is aligned with objects or surfaces in the environment of the actuator. When cover body 403 is pulled away from chassis 210 or when cover body 403 is pushed onto chassis 210, the protruding sliders of cover fastener assemblies 220 may retract to allow for coupling and decoupling. While two cover fastener assemblies are illustrated as present on chassis assembly 700, it should be understood that fewer or greater numbers of cover fastener assemblies 220 may be present in other embodiments.

Fastener pass-throughs 707 (707-1 and 707-2) may allow for fasteners to be installed through a front of chassis 210 to attach backplate 260 to a surface, such as a wall. By virtue of chassis 210 being fastened to backplate 260, chassis 210 is also fastened to the surface. Fasteners may attach with a surface through fastener openings 706 (706-1, 706-2). Fastener pass-throughs 707 may allow for a screw driver or other installation tool to be used to attach fasteners, such as screws, through chassis 210 to backplate 260. Backplate 260 may have a flat exterior surface to permit backplate 260 to be attached flush to a surface, such as a wall. Such attachment may occur over a location where control wires, such as HVAC control wires, pass through an opening in a wall.

Various compartments may be defined by chassis 210 of chassis assembly 700, including battery compartment 710 and/or control wire compartment 725. Battery compartment 710 may be used to house one or more batteries, such as batteries 265. When batteries are installed in battery compartment 710 and rotatable cover assembly 400 is removed from chassis assembly 700, batteries 265 may be partially visible. Battery holder tab 701 may help keep batteries in position within battery compartment 710 such that the batteries properly contact spring cap 242, spring cap 244, battery contact 240, and battery contact 245 when rotatable cover assembly 205 is attached with chassis assembly 700. That is, a back surface of battery holder tab 701 may be made of a flexible material and may be curved to roughly match a curvature of cylindrical batteries that are to be installed in battery compartment 710; the inner surface of rotatable cover assembly 205 may keep battery holder tab 701 pressed against the batteries and in a proper position within battery compartment 710. Battery holder tab 701 may be connected to a flexible ribbon leash 711. Ribbon leash 711 may serve multiple purposes. First, ribbon leash 711 may help prevent battery holder tab 701 from being lost by battery holder tab 701 being permanently attached to battery holder tab 701 and to chassis 210. When battery holder tab 701 is pulled by a user, ribbon leash 711 may push batteries out of battery compartment 710 due to ribbon leash 711 residing under batteries 265 when batteries 265 are installed in battery compartment 710. Therefore, battery holder tab 701 and attached battery ribbon leash 711 may function together as a single structure to both: 1) hold batteries in place within battery compartment 710; and 2) help remove batteries from battery compartment 710. It should be understood that battery holder tab 701 and ribbon leash 711 may be adapted for use with fewer or greater numbers of batteries.

Figure 7C:
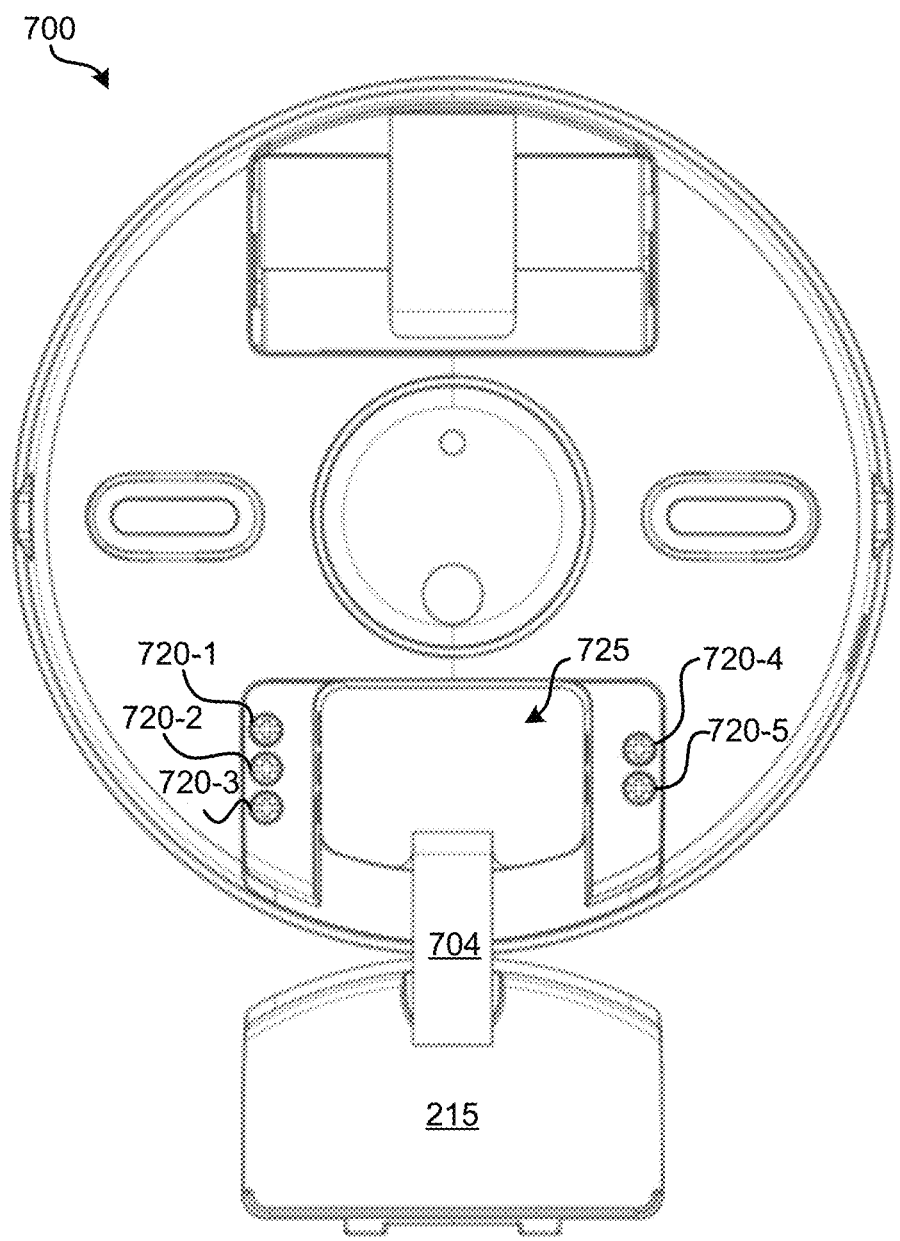
FIG. 7C illustrates a front view of an embodiment of a chassis assembly with an HVAC wiring connector cover in an open position.

FIG. 7C illustrates a front view of an embodiment of chassis assembly 700 with wiring connector cover 215 in an open position. When wiring connector cover 215 is open, terminals 720 (e.g., 720-1, 720-2, 720-3, 720-4, and 720-5) may be accessible. control wires, such as HVAC control wires, may enter control wire compartment 725 through rear opening 703. When chassis assembly 700 is mounted to a wall, wiring connector cover 215 can be hung in an open position. In such a position, it may be possible to attach rotatable cover assembly 205 to chassis assembly 700.

Cover leash 704 may be rubber or some other flexible or semi-rigid material. When wiring connector cover 215 is closed, access to terminals 720 is prevented and cover leash 704 may be stored within control wire compartment 725.

Figure 8:
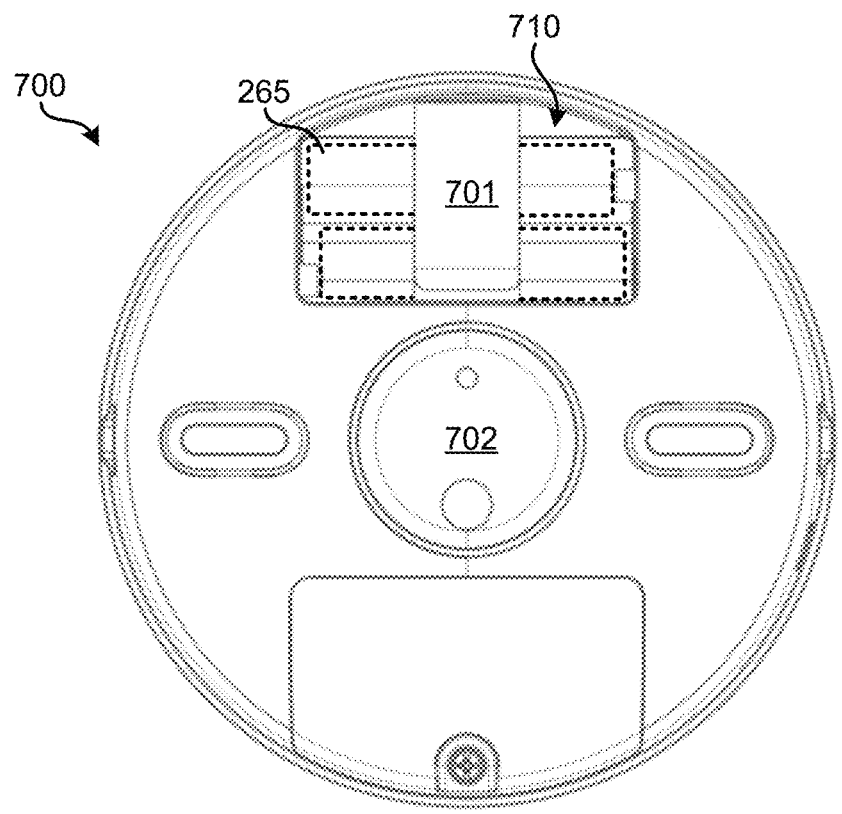
FIG. 8 illustrates a front view of an embodiment of a chassis assembly with a rotatable cover assembly removed.

FIG. 8 illustrates a front view of chassis assembly 700 with rotatable cover assembly 205 removed. As can be seen, batteries 265, when installed, reside below battery holder tab 701, but above ribbon leash 711. Therefore, when battery holder tab 701 is pulled away from chassis 210, ribbon leash 711 will extend away from battery compartment 710 and will push batteries 265 from battery compartment 710.

Figure 9:
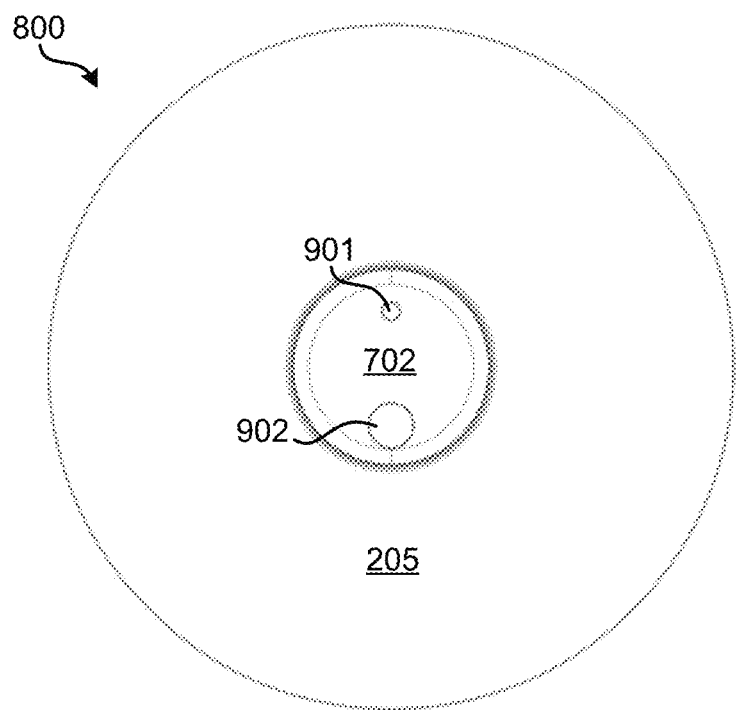
FIG. 9 illustrates a front view of an embodiment of an actuator device in which the rotatable cover assembly is attached to the chassis assembly.

Dead front display 702 may function as a display and as a button (button 702). FIG. 9 illustrates a front view of actuator 200 in which rotatable cover assembly 205 is removably attached with chassis assembly 700. When rotatable cover assembly 205 is attached with chassis assembly 700, dead front display 702 remains exposed and visible. Dead front display 702 may appear to have a blank display surface when no internal light behind the dead front display surface is illuminated. Region 901 or region 902 may be at least partially illuminated from within chassis assembly 700 when one or both of the internal lights are illuminated. Various graphics, numbers, or letters may be illuminated by etching such graphics, numbers, or letters into a layer of regions 901 and 902. It should be understood that the number of regions may be greater or fewer depending on the number of items desired to be displayed on dead front display 702. The dead front display surface may be movable with respect to the opening in the rotatable cover assembly 205. A user may press dead front display 702 such that dead front display 702 depresses a distance and functions as a button.

Figure 10A:
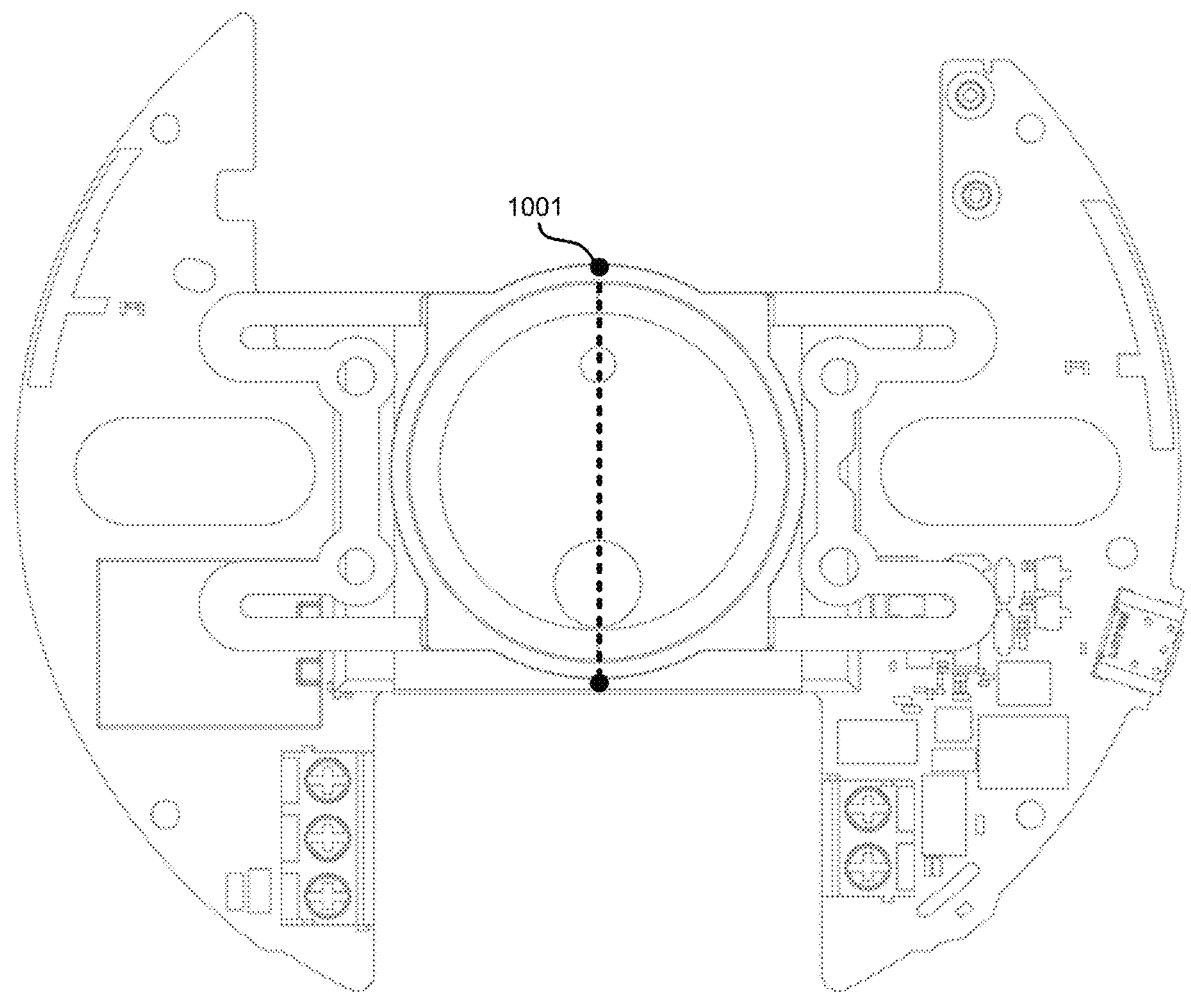
FIG. 10A illustrates a top view of an embodiment of a button, rubber boot assembly, a light pipe assembly, and a PCB.
Figure 10B:
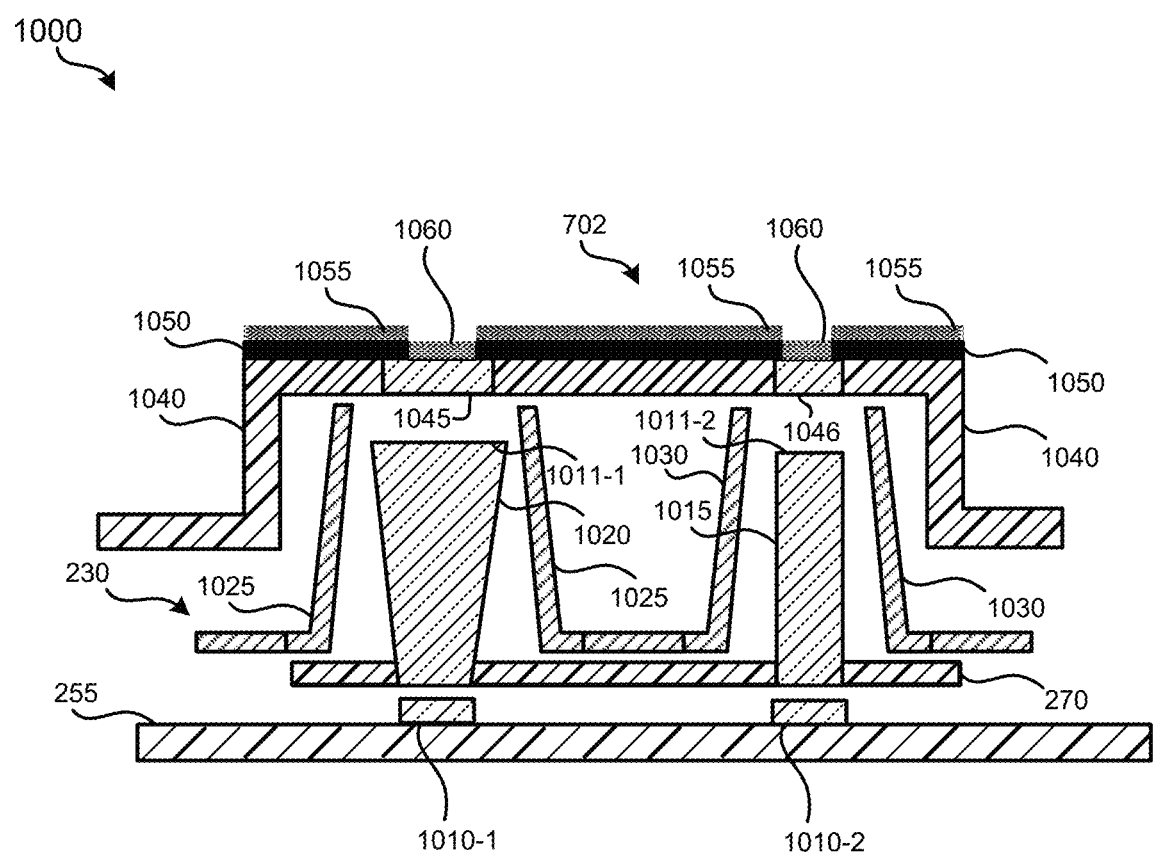
FIG. 10B illustrates a cross-section of an embodiment of a button, a rubber boot assembly, a light pipe assembly, and a PCB.

FIG. 10A illustrates a top view of an embodiment of a button, rubber boot assembly, a light pipe assembly, and a PCB. FIG. 10A illustrates a location of cross-section 1000. The location of cross-section 1000 may also be indicative of the location of cross-section 1100 of FIG. 11 and 1200 of FIG. 12. FIG. 10B illustrates a cross-section 1000 of button 702, light boot assembly 230, light pipe assembly 270, and PCB 255. In cross-section 1000, two lighting elements, which may be LEDs, are mounted on PCB 255: lighting element 1010-1 and lighting element 1010-2. Lighting element 1010-1, when active, emits light into light pipe 1020 of light pipe assembly 270. Lighting element 1010-2, when active, emits light into light pipe 1015 of light pipe assembly 270. Light pipes 1020 and 1015 may have different shapes to illuminate different sizes of graphics, icons, text, or numbers on button 702. For instance, light pipe 1020 may have a wider top than light pipe 1015 to accommodate even illumination of a larger graphic on button 702. Light pipes 1020 and 1015 may be made from a transparent or translucent material, such as glass or clear plastic. Due to the refraction index between air and the transparent or translucent material of light pipes 1020 and 1015, most light emitted by lighting elements 1010 may be internally reflected within light pipes 1015 and 1020 and emitted from front surfaces 1011-1 and 1011-2.

Rubber boot 1025 may be opaque and prevent stray light from light pipe 1020 (e.g., light emitted from a side of light pipe 1020) or light from lighting element 1010-1 from inadvertently allowing reflected light to exit the actuator. Rubber boot 1030 may also be opaque and prevent stray light from light pipe 1015 (e.g., light emitted from a side of light pipe 1015) or light from lighting element 1010-2 that did not enter light pipe 1015 from inadvertently allowing reflected light to exit the actuator. When button 702 is depressed, light pipes 1020 and 1015 may be unaffected, but rubber boots 1025 and 1030 may be partially compressed or deformed. While being compressed or deformed, rubber boots 1025 and 1030 may continue to block light from being reflected to an undesired location. In other embodiments, rubber boots 1025 and 1030 may be formed from some other flexible or semi-flexible material. In still other embodiments, rubber boots 1025 and 1030 may be located at least a distance from button 702 such that when button 702 is depressed, button 702 does not touch rubber boots 1025 or 1030. Such an arrangement may permit rubber boots 1025 or 1030 to be formed from a rigid or semi-rigid material, such as plastic or metal.

Light from lighting element 1010-1 may primarily be emitted through front surface 1011-1. Similarly, light from lighting element 1010-2 may primarily be emitted through front surface 1011-2. Button 702 may include body 1040, which may be formed from an opaque material, such as plastic or metal. Body 1040 may have regions, such as region 1045 and region 1046, that are filled with a translucent or transparent material, such as plastic or glass. Regions 1045 and 1046 can refer, for example, to regions 902 and 901, respectively, of FIG. 9.

On a front surface of body 1040, a coat of opaque paint 1050, which may be black, may be applied. This opaque paint may block light from being emitted through a front of body 1040. A portion of this opaque paint 1050 may be removed, such as via laser etching, to form one or more graphics, icons, letters, or numbers over regions 1045 and 1046. The front surface, over the coat of opaque paint 1050 and etched portions, may be coated with semi-transparent paint 1055, which may be gray or some other color. Semi-transparent paint 1055 may allow light to be passed through in regions 1060 where the semi-transparent paint is affixed directly to regions 1045 and 1046. When light is not being illuminated through regions 1045 and 1046, a front of button 702 may appear blank or a "dead" front. Due to removal having been performed to some portion of opaque paint 1050, regions 1060 may appear slightly depressed or inset from a front surface of button 702.

While cross-section 1000 illustrates two light pipes 1020 and 1015, which are of different shapes, it should be understood that cross-section 1000 is merely an example. In other embodiments, greater or fewer numbers of light pipes may be present. Further, the light pipes may be of the same shape or various other shapes.

Figure 11:
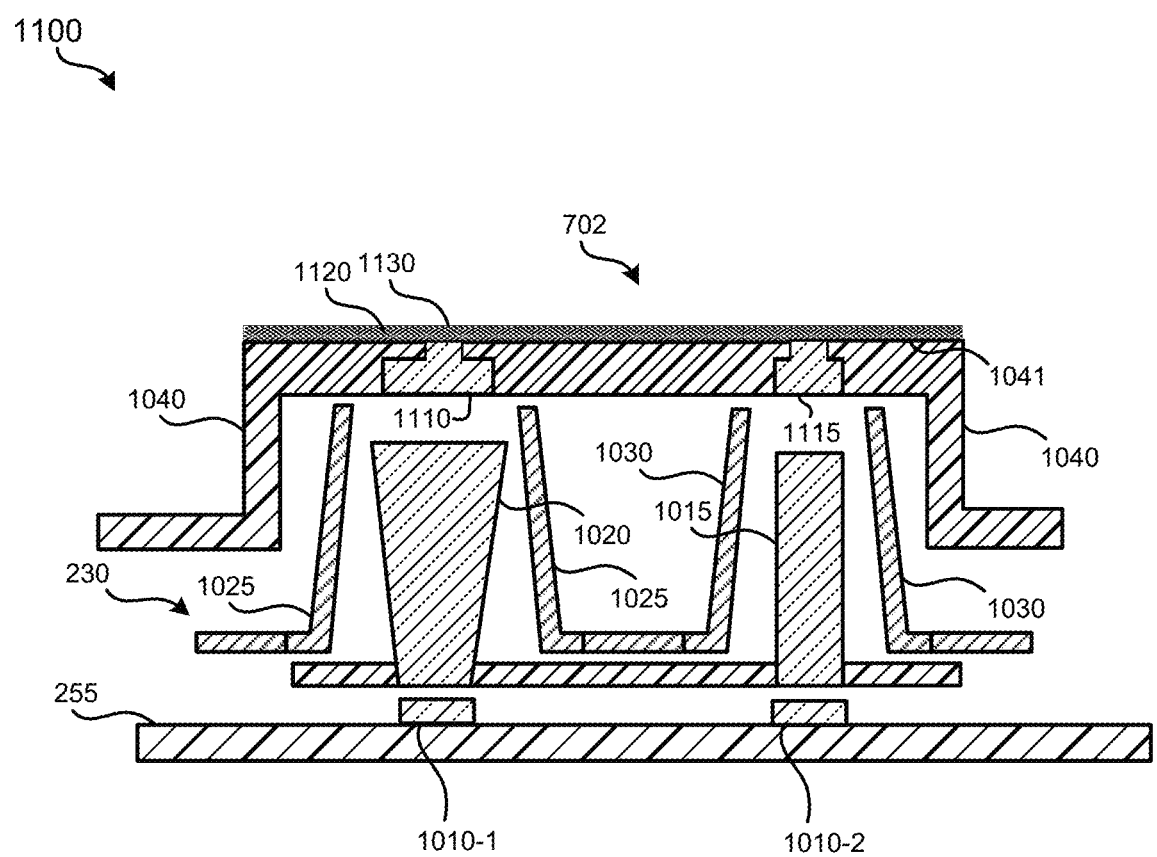
FIG. 11 illustrates a cross-section of an embodiment of a button, a rubber boot assembly, a light pipe assembly, and a PCB.

FIG. 11 illustrates a cross-section 1100 of button 702, light boot assembly 230, light pipe assembly 270, and PCB 255 as indicated by the line 1001 in FIG. 10A. The embodiment of FIG. 11 functions differently in that a dead front of button 702 is achieved in a different way than in FIG. 10. In FIG. 11, transparent inserts 1110 and 1115 are inserted into cutouts within body 1040 such that on a top surface 1041 of body 1040, the inserts are exposed and shaped to match the graphic, icon, letters, or numbers that are to be displayed when the corresponding lighting element is lit. In some embodiments, there is a paint layer, which may be black, atop transparent inserts 1110 and 1115 that may be etched to form the desired icon shape. The top surface of body 1040, along with the top surfaces of transparent inserts 1110 and 1115, may be coated in a semi-transparent paint 1120, which may be gray or some other color. Since no etching is performed, a top surface 1130 of button 702 may be flat. When lighting elements 1010 are not emitting, top surface 1130 may appear blank (e.g., a "dead front"). When lighting element 1010-1 is emitting light, the shape formed on top surface 1041 may be illuminated through semi-transparent paint 1120. The embodiment of FIG. 11 may require fewer manufacturing steps to manufacture than the embodiment of FIG. 10 since no etching is needed. In some embodiments, rubber boot 1025 and rubber boot 1030 may not contact light pipes 1020 and 1015. By not touching, the efficiency of light pipes 1020 and 1015 may be improved by the difference in refraction index between light pipes 1020 and 1015 and air allowing for full internal reflection of light travelling through light pipes 1020 and 1015. If rubber boot 1025 or rubber boot 1030 contacted a side of light pipes 1020 and 1015, this full internal reflection may not be achieved.

Figure 12:
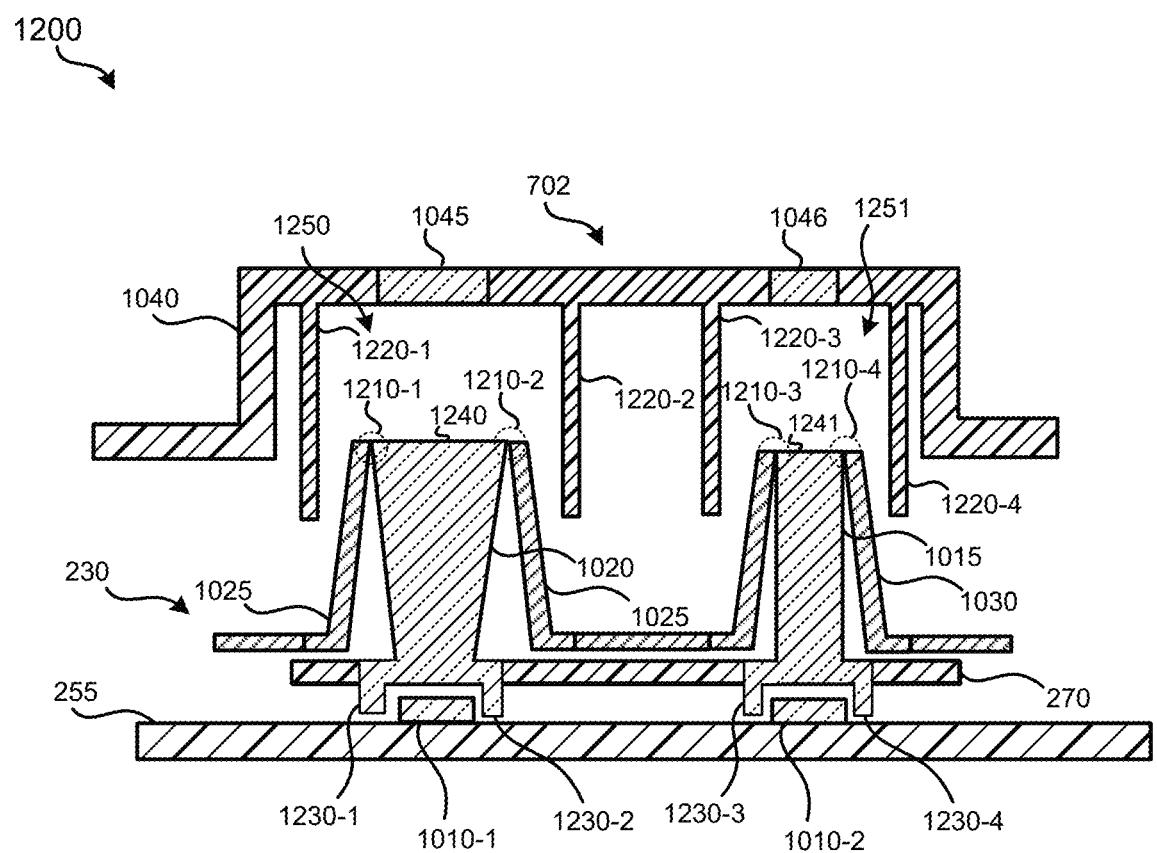
FIG. 12 illustrates a cross-section of an embodiment of a button, a rubber boot assembly, a light pipe assembly, and a PCB.

FIG. 12 illustrates an embodiment 1200 of a cross-section of button 702, light boot assembly 230, light pipe assembly 270, and PCB 255 as indicated by the line 1001 in FIG. 10A. Embodiment 1200 may be used in conjunction with the "dead-front" embodiments detailed in relation to FIGS. 11 and 12 or may be used separately. Embodiment 1200 includes features that make it more difficult for stray light from lighting element 1010 to exit the actuator device, other than through the corresponding transparent inserts. In embodiment 1200, light pipe extensions 1230 (1230-1, 1230-2, 1230-3, and 1230-4) extend downward from light pipe assembly 270 and serve to capture additional light from lighting elements 1010. Light pipe extensions 1230, in combination with a lower surface of light pipes 1015 and 1020, partially enclose lighting elements 1010. In some embodiments, light pipe extensions 1230-1 and 1230-2 may be part of a single continuous structure that encircles lighting element 1010-1. In some embodiments, light pipe extensions 1230-3 and 1230-4 may be part of a single continuous structure that encircles lighting element 1010-2. In some embodiments, light pipe extensions 1230 may touch PCB 255 to increase the collection of light emitted from lighting elements 1010.

Additionally or alternatively, light boot assembly 230 may contact light pipes 1015 and 1020 at an edge of light pipe top surfaces 1240 and 1241. At contact points 1210-1 and 1210-2, rubber boot 1025 may contact light pipe 1020. This arrangement may help prevent light emitted from sides of light pipe 1020 other than top surface 1240 from escaping from the actuator device. Similarly, at contact points 1210-3 and 1210-4, rubber boot 1030 may contact light pipe 1015. This arrangement may help prevent light emitted from sides of light pipe 1020 other than top surface 1240 from escaping from the actuator device. While two contact points are illustrated for each of light pipes 1015 and 1020, it should be understood that this is due to a cross-section being illustrated in embodiment 1200. It should be understood that rubber boot 1025 may contact and encircle top surface 1240. Similarly, rubber boot 1030 may contact and encircle an edge of top surface 1241.

Additionally or alternatively, light containment extensions 1220 may extend downward from button 702. Light containment extensions 1220 may prevent light emitted from top surfaces 1240 and 1240 from exiting the actuator device from any location other than through corresponding transparent regions 1045 and 1046. As such, a user may not view light in any unintended region of the actuator device. Light containment extensions 1220 may be made from an opaque material, such as a same type of material (e.g., plastic) as body 1040. Light containment extensions 1220 may extend from button 702 towards PCB 255 and may form partially-enclosed cavities 1250 and 1251. Light pipes 1015 and 1020 may extend partially into cavities 1250 and 1251. Ample room within cavities 1250 and 1251 may be present between top surfaces 1240 and 1241 such that, when button 702 is fully depressed, button 702 or light containment extensions 1220 do not contact PCB 255, light boot assembly 230 or light pipe assembly 270. It should be understood that light containment extensions 1220-1 and 1220-2 may be part of a continuous light containment extension that forms cavity 1250. Similarly, it should be understood that light containment extensions 1220-3 and 1220-4 may be part of a continuous light containment extension that forms cavity 1251.

Figure 13A:
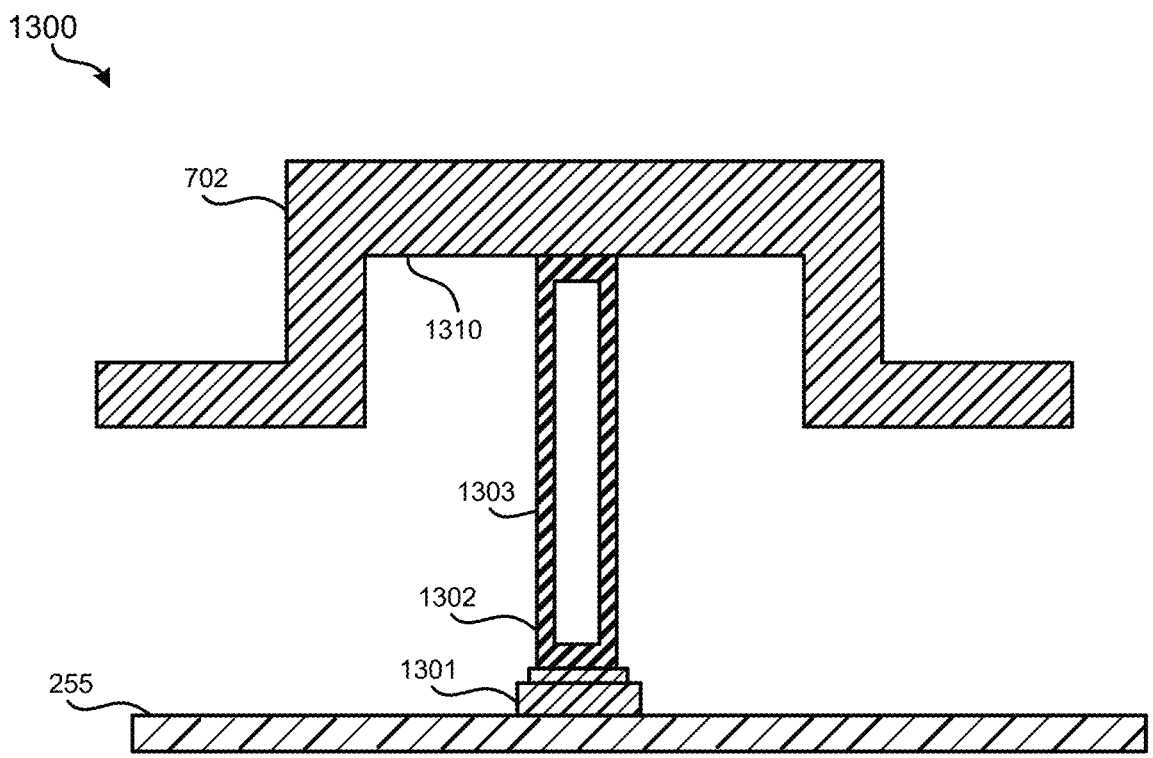
FIGS. 13A and 13B illustrate an embodiment of a cross section of a button, a compressible extension, a switch, and a PCB.
Figure 13B:
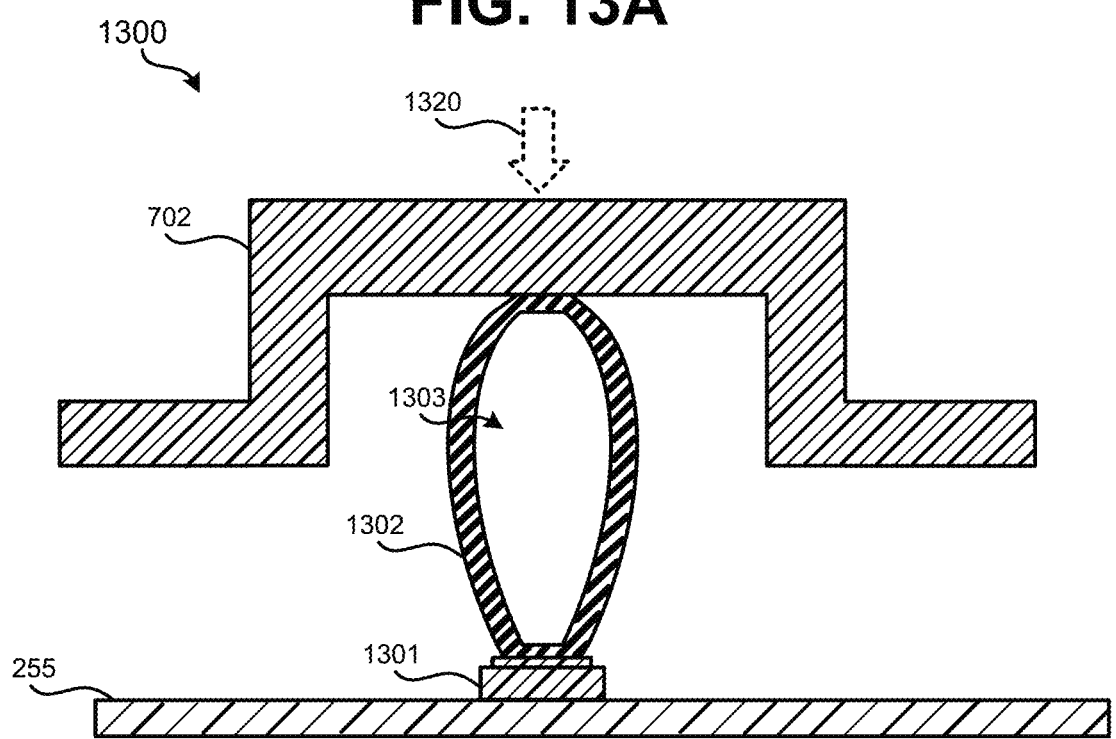

FIGS. 13A and 13B illustrate an embodiment of cross section 1300 of button 702, compressible extension 1302, switch 1301, and PCB 255. Cross section 1300 can represent an embodiment of a cross section in the location of cross section 1000 (without any light pipes or rubber boots illustrated for simplicity). In the embodiment of cross section 1300, button 702 can be pushed by a user. When button 702 is depressed, button 702 travels towards PCB 255; however, PCB 255 remains in a fixed location. As such, when pushed, button 702 becomes closer to PCB 255. Switch 1301 may be soldered (surface mount, throughmount) or otherwise affixed to PCB 255. When button 702 is pushed, switch 1301 may be actuated such that one or more components on PCB 255 (e.g., a processor) can determine that button 702 has been pushed.

Compressible extension 1302 may extend from a bottom surface 1310 of button 702 to switch 1301. Compressible extension 1302 may be hollow, such that an outer wall encloses a cavity 1303 filled with air. In other embodiments, multiple flexible supports may extend from bottom surface 1310 to switch 1301 such that cavity 1303 is not enclosed, but is rather an open region. Compressible extension 1302 may be made from a flexible or semi-rigid material that is rigid enough that when button 702 is depressed, compressible extension 1302 exerts sufficient force to actuate switch 1301. For example, compressible extension 1302 may be made from rubber or plastic. When switch 1301 has been actuated but button 702 is further depressed, compressible extension 1302 may flex. This flexing may prevent excessive force from being exerted onto switch 1301 and/or PCB 255, which could damage various components (e.g., break switch 1301, bend PCB 255).

A switch may be damaged by impact force on the button surface. The structures of FIGS. 13A and 13B prevent damage by helping to absorb impact energy that would cause damage to switch 1301 without being flexible at normal use forces. Such an arrangement can prevents the button from feeling "mushy" (e.g., can help maintain a feeling of a tactile click). As shown in FIG. 13A, when button 702 is not pushed or insufficient pressure is exerted, compressible extension 1302 is in a fully extended state. As shown in FIG. 13B, when sufficient pressure is exerted on button 702 (as indicated by arrow 1320), switch 1301 is actuated and compressible extension 1302 flexes outward to prevent excessive force from being transferred to switch 1301 and PCB 255. In some embodiments, cavity 1303 may grow in volume by one or more walls of compressible extension 1302 flexing outward. (If cavity 1303 is enclosed, one or more pressure-compensating holes may be present to allow air to enter and leave cavity 1303.) If cavity 1303 is not enclosed, but rather multiple supports make up compressible extension 1302, these supports may flex outward from a relaxed or extended position. When pressure is stopped being applied to button 702, button 702 will move away from PCB 255 and compressible extension 1302 will return to the relaxed or extended position of FIG. 13A. Such embodiments may decrease the manufacturing cost of the actuator by allowing switch 1301 to be mounted in a fixed location on PCB 255, but still help prevent damage to PCB 255 and/or switch 1301 if undue pressure is applied to button 702.

Referring to FIG. 11, when button 702 is pressed, sufficient distance between light pipes 1015 and 1020 and button 702 may be present such that button 702 does not contact light pipes 1015 and 1020, which may be rigid. Contact between button 702 and rubber boots 1025 and 1030 may occur; however, since rubber boots 1025 and 1030 are flexible or compressible, rubber boots 1025 and 1030 may compress or deform temporarily while button 702 is depressed. While compressed or deformed, rubber boots 1025 and 1030 may continue to block light leakage from sides of light pipes 1015 and 1020.

Figure 14:
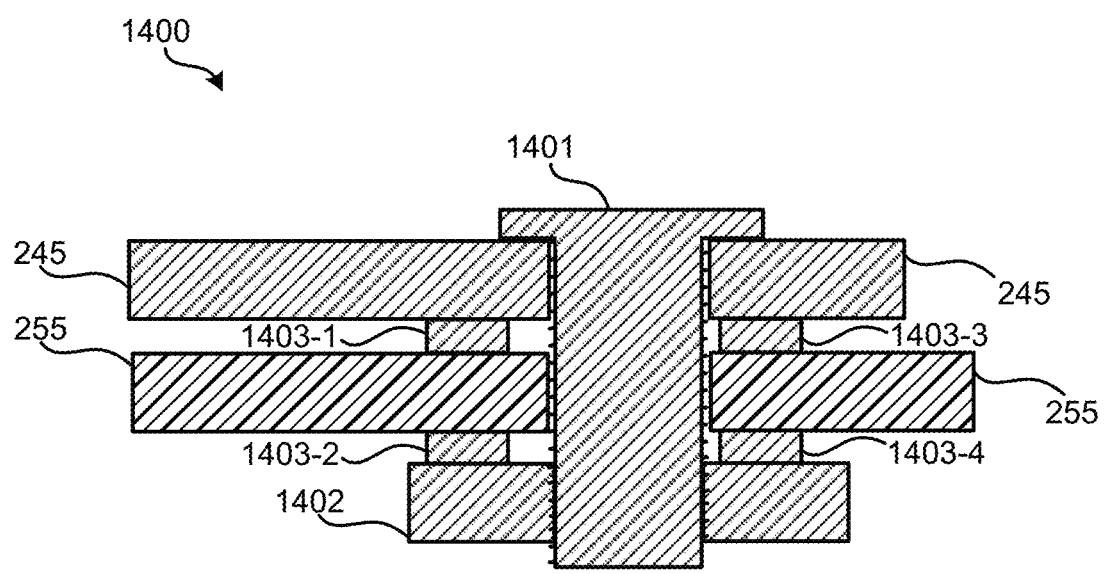
FIG. 14 illustrates an embodiment of a cross-section of a battery contact that is electrically connected with contacts on a PCB.

FIG. 14 illustrates an embodiment 1400 of a cross-section of a battery contact that is electrically connected with contacts on PCB 255. In embodiment 1400, battery contact 245, which may contact a terminal of a battery, is illustrated. In order to firmly affix battery contact 245 to PCB 255, an arrangement that will be resilient enough to withstand multiple impacts may be useful. For instance, a soldered connection may be insufficient to protect a connection between battery contact 245 and an electrical contact on PCB 255 if the actuator device has a significant impact, such as a drop of a meter or greater. Bolt 1401 (or some other form of screw) may pass through an opening in battery contact 245. Both of bolt 1401 and battery contact 245 may be conductive, such as by being made of metal. Bolt 1401 may pass through a mounting hole in PCB 255. Bolt 1401 may be fastened to nut 1402, which may also be made of metal, such that a head of bolt 1401 provides pressure on a surface of battery contact 245 and nut 1402 provides pressure on an opposite side of PCB 255. This pressure may help maintain an electrical connection between bolt 1401, nut 1402, battery contact 245, and various electrical contacts 1403 (e.g., 1403-1, 1403-2, 1403-3, and 1403-4) arranged on PCB 244 to electrically connect battery contact 245 with power circuitry on PCB 255. Battery contact 240 may be connected with PCB 255 in the same or a similar manner.

Figure 15A:
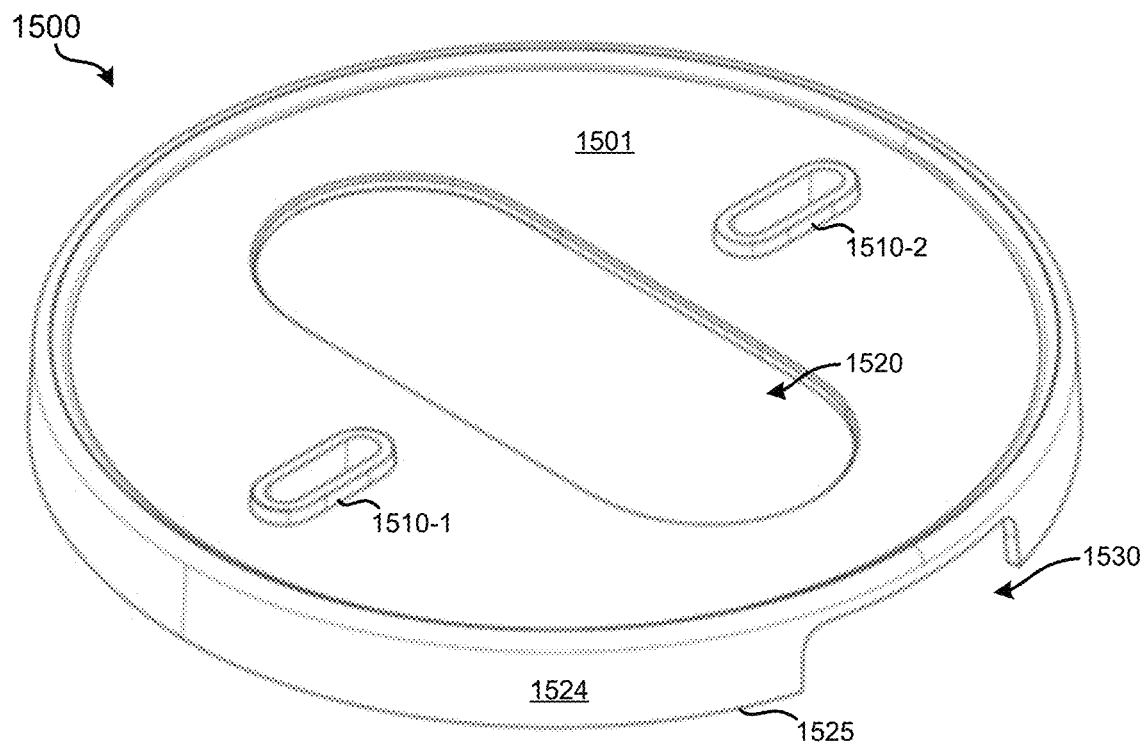
FIG. 15A illustrates a front view of an embodiment of a mounting plate.
Figure 15B:
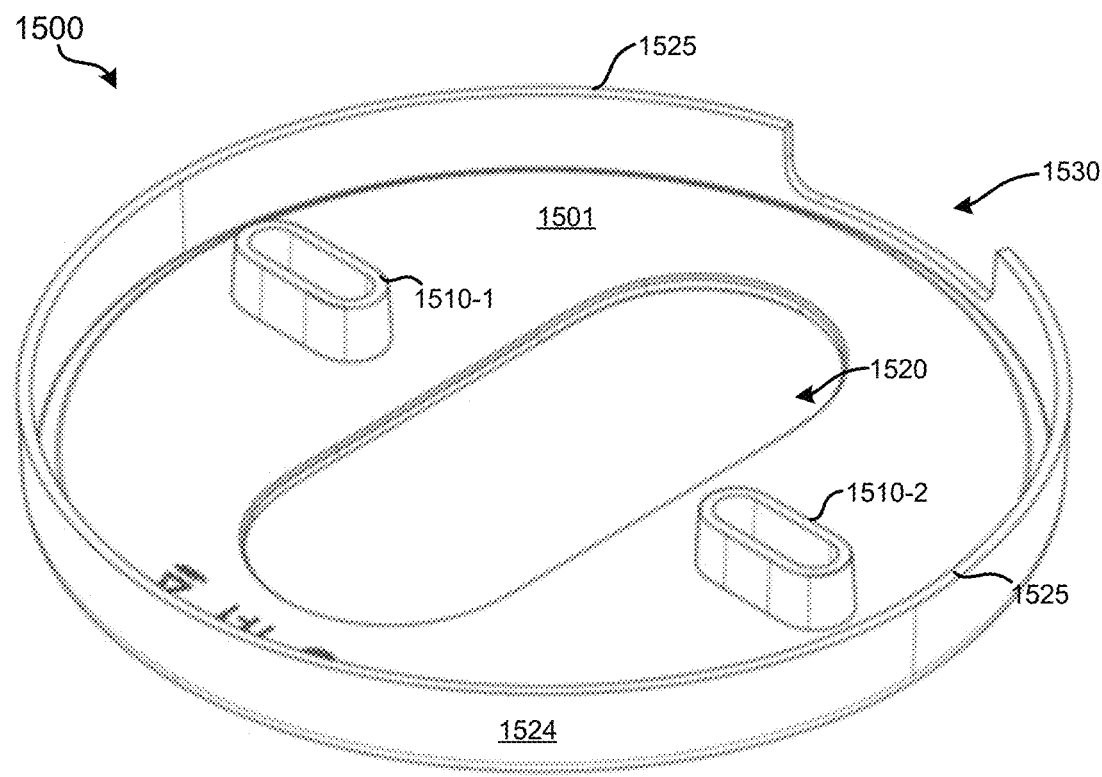
FIG. 15B illustrates a back view of an embodiment of a mounting plate.

FIGS. 15A and 15B illustrate an embodiment of mounting plate 1500. In FIG. 15A, a front side of an embodiment of mounting plate 1500 is illustrated. In FIG. 15B, a back side of an embodiment of mounting plate 1500 is illustrated. Mounting plate 1500 may optionally be positioned between backplate 260 and a surface to which actuator 200 is to be attached. Mounting plate 1500 may be used if control wires, such as HVAC control wires, are routed external to the surface to which actuator 200 is to be attached. If HVAC control wires are routed external to the surface, mounting plate 1500 may provide clearance such that control wires can be routed through backplate 260, while still allowing actuator 200 to be mounted securely with the surface. Body 1501 may be constructed of a rigid or semi-rigid material, such as plastic. On body 1501, fastener pass-throughs 1510 (1510-1 and 1510-2) may be present. Fastener pass-throughs 1510 may allow fasteners (e.g., screws, nails) that are fastened through fastener pass-throughs 707 to also pass through mounting plate 1500. Fasteners through both sets of fastener pass-throughs may hold chassis assembly 700 and mounting plate 1500 firmly against a surface into which the fasteners are installed. Control wiring may be routed along the surface through sidewall gap 1530, such that HVAC control wiring can pass through opening 1520 defined by body 1501. Such HVAC control wiring can then be passed through rear opening 703 and into the control wiring compartment 725 and connected with terminals 720.

A back edge 1525 of sidewall 1524 may seat flush against a flat surface (e.g., wall) to which mounting plate 1500 is attached. sidewall 1524 may keep the main surface of body 1501 a distance from the surface, allowing ample room for control wiring to be routed through sidewall gap 1530 and through opening 1520.

Figure 16A:
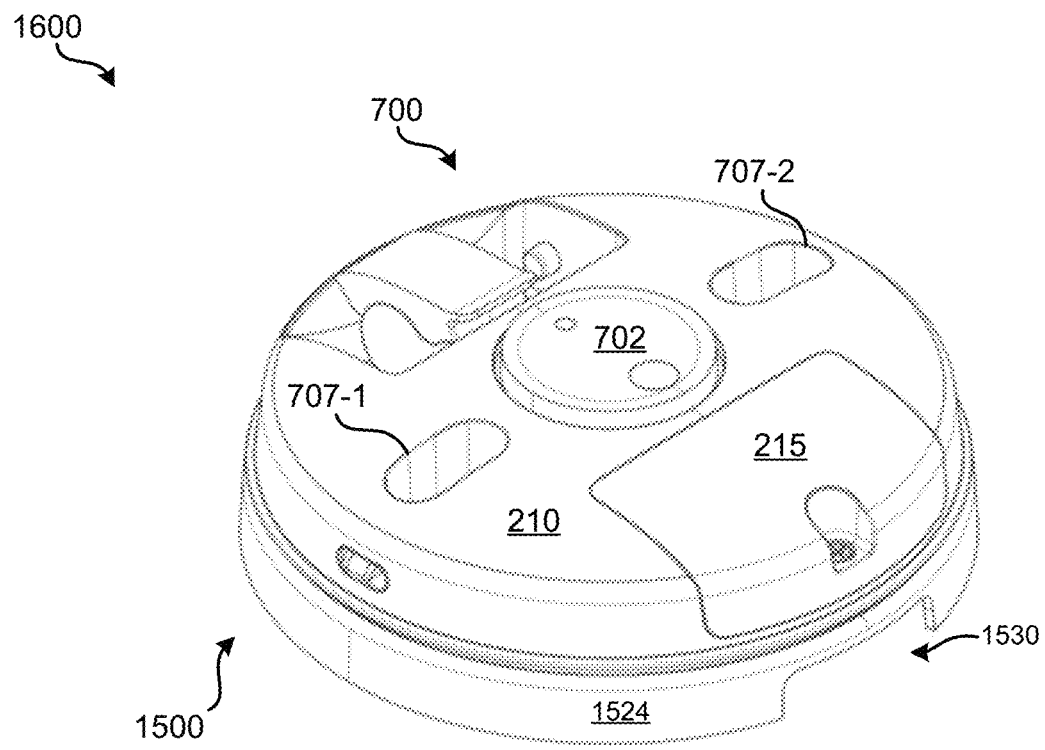
FIG. 16A illustrates a front view of an embodiment of a chassis assembly mounted on a mounting plate.
Figure 16B:
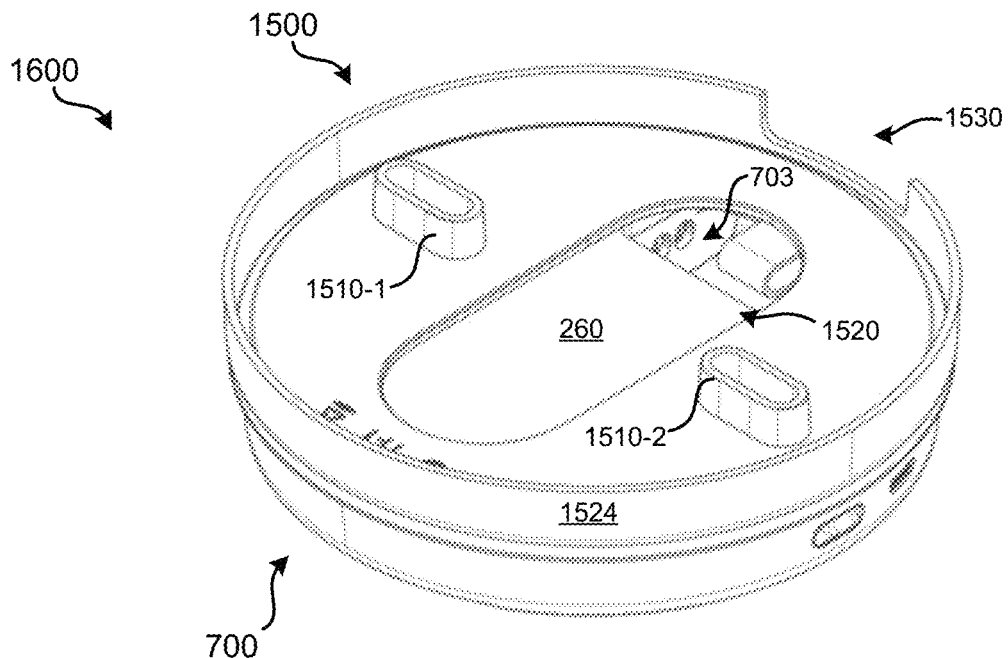
FIG. 16B illustrates a back view of an embodiment of a chassis assembly mounted on a mounting plate.

FIGS. 16A and 16B illustrate an embodiment 1600 of chassis assembly 700 mounted on mounting plate 1500. Chassis assembly 700 may be held against mounting plate 1500 by fasteners that pass through fastener pass-throughs 707 and fastener pass-throughs 1510. Such fasteners may be fastened into the surface to which actuator 200 is to be mounted. As can be seen in FIG. 16B, when chassis assembly 700 is properly mounted on mounting plate 1500, opening 1520 of mounting plate 1500 at least partially overlaps rear opening 703 of backplate 260 such that control wiring can be passed through sidewall gap 1530, opening 1520, and into the control wire compartment 725 through rear opening 703 of backplate 260.

While FIGS. 2-14 were directed to embodiments of actuator 110, FIGS. 17-25 are directed to embodiments of stand device 150. In the following description, a smart home device comprising a thermostat will be described. It will, however, be appreciated that one or more of the features described herein may be used with other smart home devices, such as a control device or a sensor or an input device, and which smart home device may include a door bell, camera, temperature sensor, smoke detector, carbon monoxide detectors, home assistants or other similar devices. FIGS. 17A and 17B illustrate an embodiment 1700 of thermostat 1705 attached to stand 1710 (which may be an embodiment of stand device 150). FIG. 17A illustrates a front view of embodiment 1700 of thermostat 1705 attached to stand device 1710. FIG. 17B illustrates a side view of embodiment 1700 of thermostat 1705 attached to stand device 1710. Stand device 1710 may permit thermostat 1750 to be powered and to be supported on a flat surface (e.g., table, shelf, desk, floor, etc.). Thermostat 1705 may be cylindrical and may have an outer ring that rotates. Ring 1706 may match a contour of stand 1710.

Figure 17B:
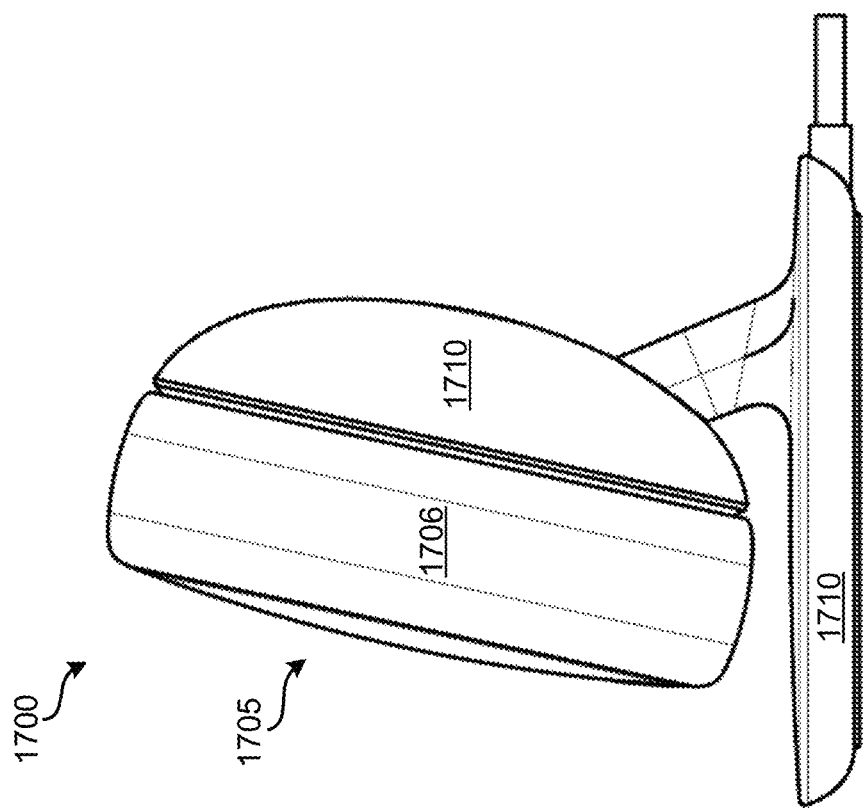
FIG. 17B illustrates a side view of an embodiment of a thermostat attached to a stand device.
Figure 17A:
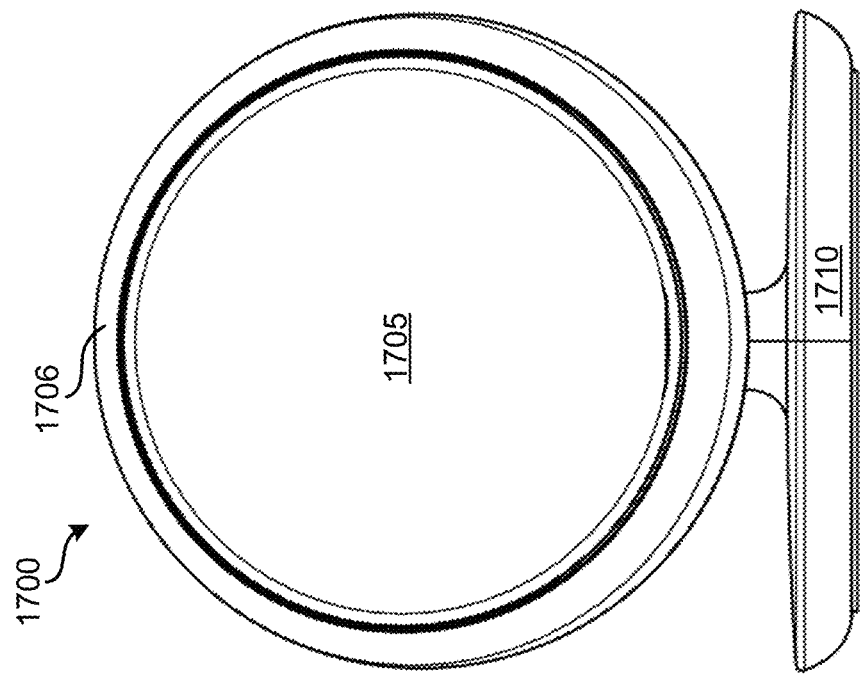
FIG. 17A illustrates a front view of an embodiment of a thermostat attached to a stand device.

FIGS. 18A and 18B illustrate an embodiment of stand assembly 1800 that includes stand device 1710 connected with cable 1801 (and without the thermostat (or other smart home device)). Cable 1801 may be a universal serial bus (USB) cable (or some other form of cable) that is being used to supply a thermostat that is connected with connector 1810 with power. USB connector 1802 may be connected to a power supply or other device that supplies an appropriate direct current voltage. Cable 1801 may be permanently connected with base 1815. Connector 1810 may be electrically connected to cable 1801 in order to provide a connected thermostat (or other form of smart home device) with power. Stand face 1805 may be a flat or nearly flat surface that allows a thermostat to sit flush on stand device 1710, as illustrated in FIGS. 17A and 17B. Base 1815 may be at least partially made from a heavier material than stand face 1805 or stand back 1806 in order for stand device 1710 to have a lower center-of-gravity and to stand regardless of whether a thermostat is attached with connector 1810. Stand back 1806 may be generally convex in shape.

Figure 19A:
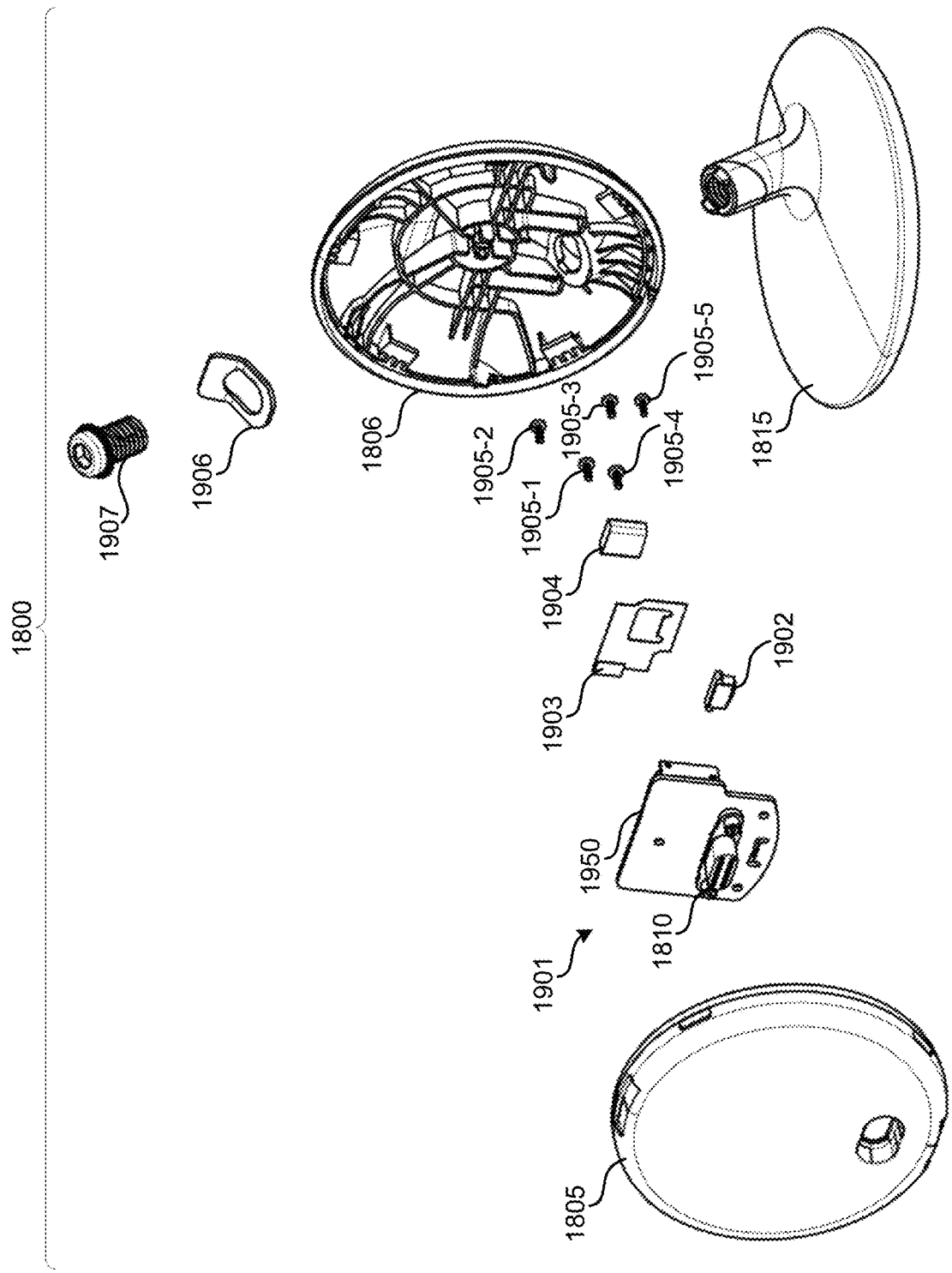
FIGS. 19A and 19B, collectively, illustrate a front view of an embodiment of a stand assembly.
Figure 19B:
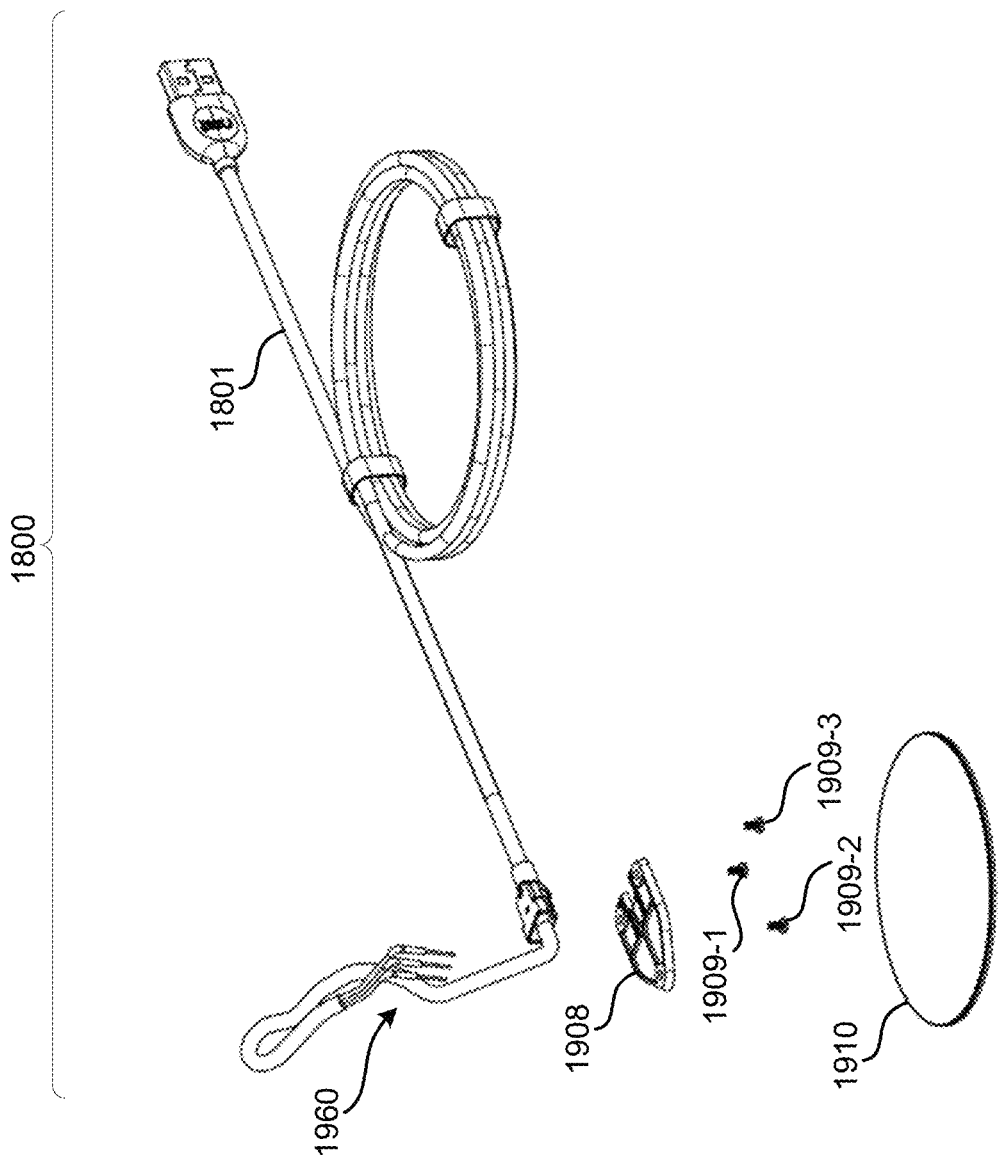

FIGS. 19A and 19B, collectively, illustrate an exploded view of stand assembly 1800. Stand assembly 1800 can include: stand face 1805; connector assembly 1901; sensor housing 1902; bracket 1903; conductive foam 1904; fasteners 1905 (1905-1, 1905-2, 1905-3, 1905-4, 1905-5); stand back 1806; stand base 1815; bracket 1906; hollow fastener 1907; cable 1801; plate 1908; fasteners 1909 (1909-1, 1909-2, 1909-3); and baseplate 1910. Present on connector assembly 1901 may be connector 1810 to which a thermostat may be removably connected. Connector assembly 1901 may include PCB 1950, to which one or more sensors, such as temperature sensors, may be located. Connector 1810 may transfer data indicative of sensor measurements, such as temperature measurements, to a connected thermostat via connector 1810 (in addition to providing power). Connector 1810 may be fastened to PCB 1950 using solder. In order to increase durability, connector 1810 may be fastened using multiple fasteners that pass through PCB 1950. For instance, bolts and nuts may be used on connector 1810 to durably hold connector 1810 to PCB 1950. Cable 1801 may be routed through hollow fastener 1907, thus allowing electrical connectors 1960 of cable 1801 to be connected with PCB 1950. Hollow fastener 1907 may be a screw that screws into threads of stand base 1815.

Figure 20:
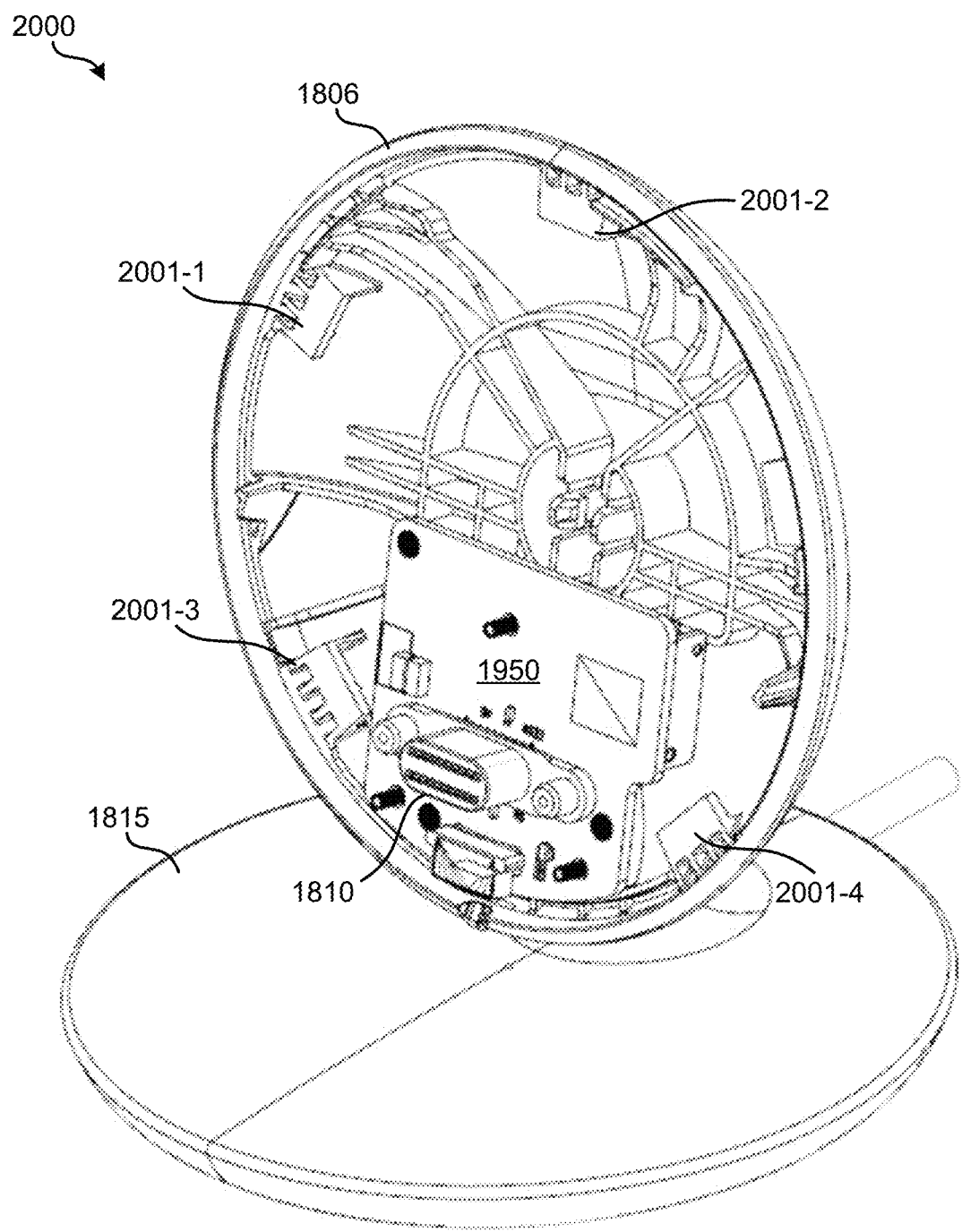
FIG. 20 illustrates an embodiment of a stand assembly with a stand face removed.

FIG. 20 illustrates an embodiment of a stand assembly 2000 with a stand face removed. Stand face 1805 may be attached to stand back 1806 without the use of any separate fasteners, such as screws. Rather, slide clips 2001 (2001-1, 2001-2, 2001-3, 2001-4), which can be referred to as radial snaps, can allow for stand face 1805 to be rotated into place against stand back 1806. First, P C B 1950 may be attached to a rear of stand face 1805. When stand face 1805 with attached PCB 1950 (and connector 1810, which at least partially protrudes through stand face 1805) is twisted against stand back 1806, slide clips 2001 may engage with counterpart slide clip receptacles on a rear of stand face 1805. By using slide clips 2001 and the slide clip receptacles on the rear of stand face 1805, stand face 1805 may be coupled with stand back 1806 without using separate fasteners or adhesive.

Figure 21A:
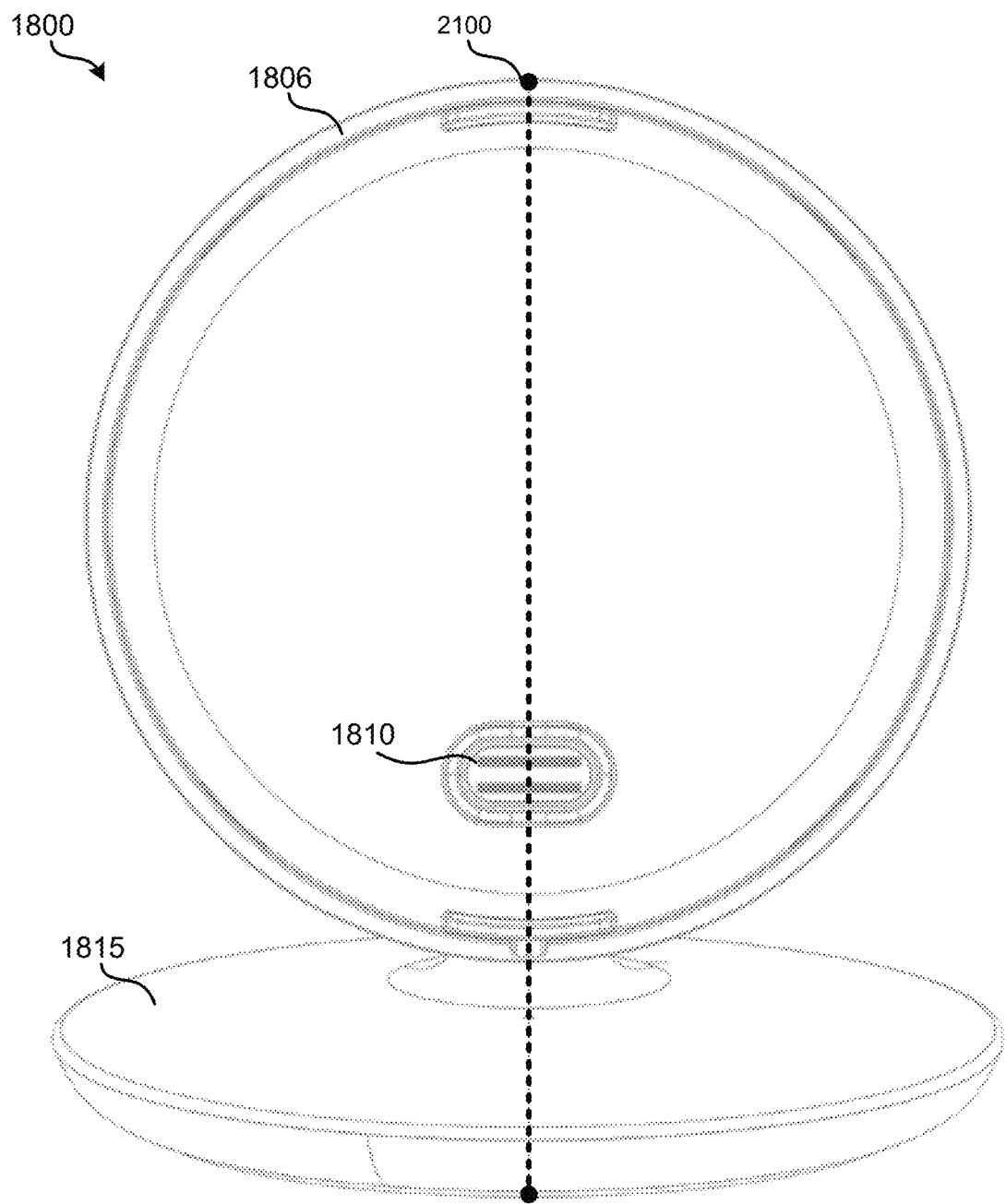
FIG. 21A illustrates an embodiment of a stand assembly.
Figure 21B:
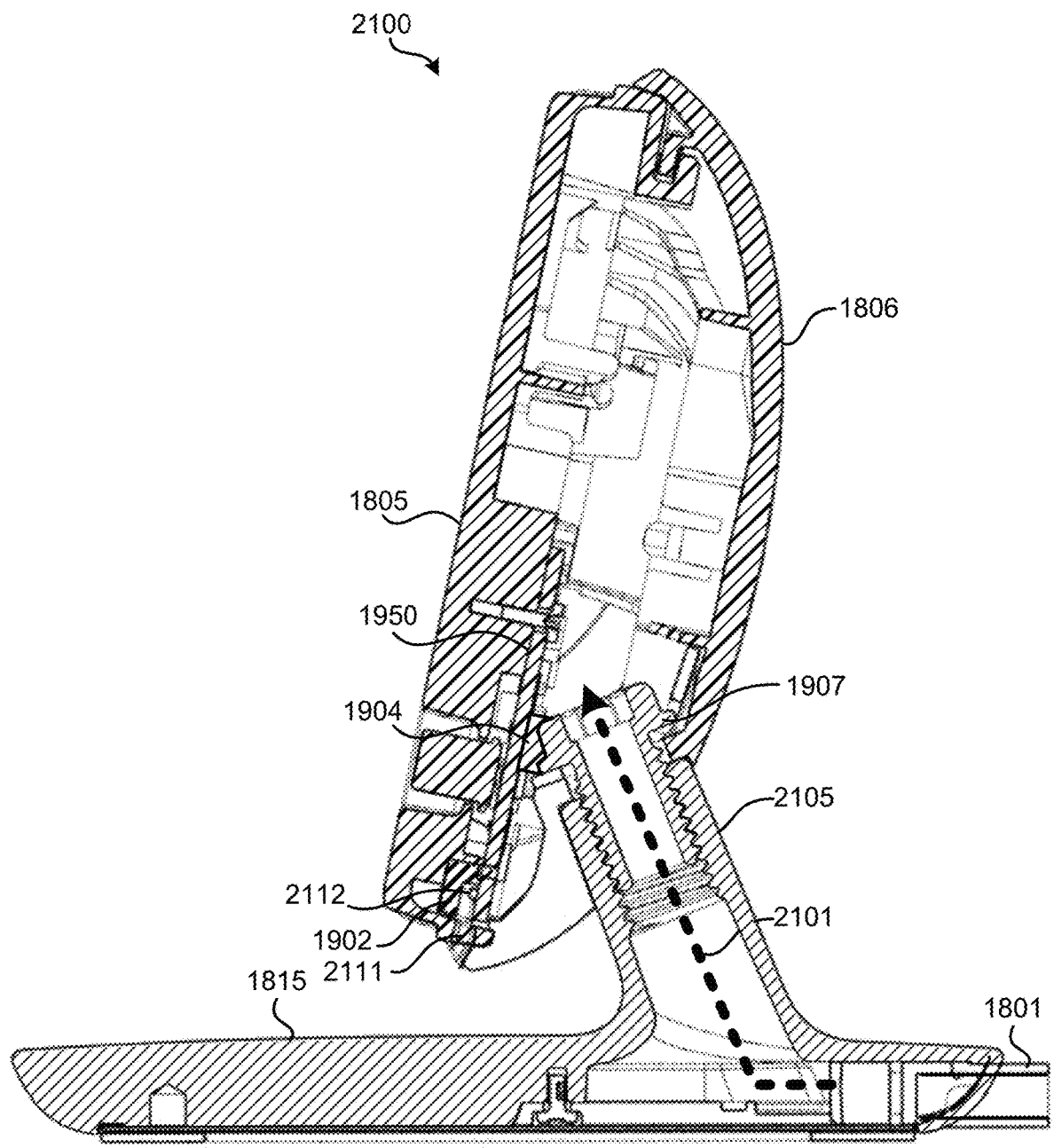
FIG. 21B illustrates a cross section of an embodiment of the stand assembly.

FIG. 21A illustrates an embodiment of a stand assembly 1800. In FIG. 21A, the location of cross-section 2100 is illustrated. FIG. 21B illustrates a cross section 2100 of an embodiment of stand assembly 1800. In the embodiment of cross-section 2100, arrow 2101 depicts the path of wiring from cable 1801. Wiring from cable 1801 may pass through a hollow center of hollow fastener 1907 and pass into an interior cavity between stand back 1806 and stand face 1805. Wiring from cable 1801 may be attached (e.g., soldered) to a contact present on PCB 1950. As such, power from cable 1801 may be supplied to PCB 1950 and a device connected with connector 1810.

Further, hollow fastener 1907 may be used to anchor stand back 1806 to base 1815. In some embodiments, stand back 1806 may first be fastened to base 1815 using hollow fastener 1907. Cable 1801 may then be attached to base 1815 and wiring from cable 1801 may be run through hollow fastener 1907. The wiring may then be connected with corresponding contacts on PCB 1950. Stand face 1805 may then be secured to stand back 1806.

Additionally or alternatively, the embodiment of cross-section 2100 can include conductive foam 1904. Conductive foam 1904 may be initially positioned and/or affixed to PCB 1950 such that conductive foam 1904 is electrically connected with a ground (e.g., a ground contact on the PCB that is connected to a ground wire of cable 1801, directly to a ground wire of cable 1801). When stand face 1805 is twisted into a locked position on stand back 1806, conductive foam 1904 may be twisted to be compressed against hollow fastener 1907. Hollow fastener 1907 may be formed from a conductive material (e.g., metal) and may further be in contact with metal of base 1815, such as base threaded region 2105. Therefore, compressed conductive foam 1904 serves to electrically connect hollow fastener 1907 and base 1815 to an electrical ground. In some embodiments, another compressible and conductive material other than foam may be used to form the electrical connection between hollow fastener 1907 and an electrical ground of PCB 1950.

Additionally or alternatively, the embodiment of cross-section 2100 can include sensor housing 1902. Sensor housing 1902 isolates airspace near temperature and/or humidity sensor 2112 from other airspace within the stand device. Via air channel 2111, which opens to the ambient environment, temperature and/or humidity sensor 2112 is exposed to the ambient environment, but is blocked from the airspace within other parts of the stand device by sensor housing 1902. In some embodiments, sensor housing 1902 is rubber, plastic, or some other flexible, rigid, or semi-rigid material.

Figure 22:
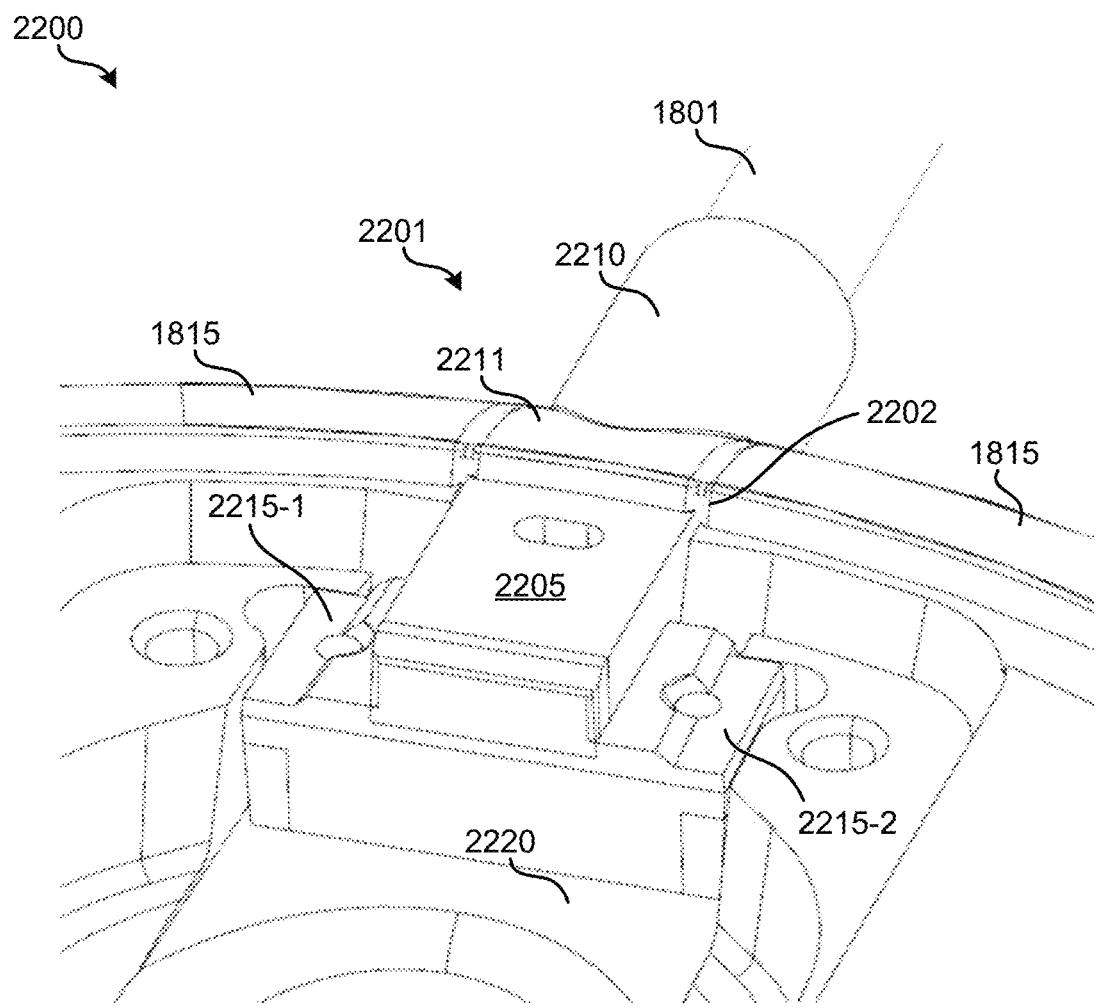
FIG. 22 illustrates a detailed image of an embodiment of a connection region between a cable and a base of a stand assembly.

FIG. 22 illustrates a detailed image of an embodiment 2200 of a connection region between a cable and a base of a stand assembly. In embodiment 2200, cable 1810 has an overmold that serves to anchor cable 1801 with base 1815. Overmold 2201 may provide strain relief, such that force applied to pulling cable 1801 does not result in force being applied to the wires or contact of cable 1801 where connected with PCB 255. Rather than a hole being present in base 1815 through which cable 1801 passes, slot 2202 is present in base 1815 into which overmold 2201 is inserted prior to baseplate 1910 being attached to base 1815. Overmold 2201 may include portion 2210, base edge portion 2211, overmold body 2205, and overmold extensions 2215 (2215-1 and 2215-2).

Base edge portion 2211 may be inserted into a slot present in an edge of base 1815. Overmold extensions 2215 may be attached, such as via fasteners, to internal structure 2220 of base 1815. In some embodiments, while portion 2210 and base edge portion 2211 are made from a flexible material, overmold body 2205 may be made from a rigid material. After base edge portion 2211 has been inserted into slot 2202 and overmold extensions 2215 anchored to internal structure 2220 of base 1815, baseplate 1910 may be attached to a bottom of base 1815, such that base 1815 rests against overmold body 2205.

The methods, systems, and devices discussed above are examples. Various configurations may omit, substitute, or add various procedures or components as appropriate. For instance, in alternative configurations, the methods may be performed in an order different from that described, and/or various stages may be added, omitted, and/or combined. Also, features described with respect to certain configurations may be combined in various other configurations. Different aspects and elements of the configurations may be combined in a similar manner. Also, technology evolves and, thus, many of the elements are examples and do not limit the scope of the disclosure or claims.

Specific details are given in the description to provide a thorough understanding of example configurations (including implementations). However, configurations may be practiced without these specific details. For example, well-known circuits, processes, algorithms, structures, and techniques have been shown without unnecessary detail in order to avoid obscuring the configurations. This description provides example configurations only, and does not limit the scope, applicability, or configurations of the claims. Rather, the preceding description of the configurations will provide those skilled in the art with an enabling description for implementing described techniques. Various changes may be made in the function and arrangement of elements without departing from the spirit or scope of the disclosure.

Also, configurations may be described as a process which is depicted as a flow diagram or block diagram. Although each may describe the operations as a sequential process, many of the operations can be performed in parallel or concurrently. In addition, the order of the operations may be rearranged. A process may have additional steps not included in the figure.

Having described several example configurations, various modifications, alternative constructions, and equivalents may be used without departing from the spirit of the disclosure. For example, the above elements may be components of a larger system, wherein other rules may take precedence over or otherwise modify the application of the invention. Also, a number of steps may be undertaken before, during, or after the above elements are considered.

What is claimed is:

1. A smart home device, comprising:
    a chassis assembly that defines one or more compartments and the chassis assembly comprises a plurality of cover fasteners, wherein
        the plurality of cover fasteners comprises a plurality of sliders;
    a rotatable cover assembly configured to be removably attached with the chassis assembly to at least partially cover a front of the chassis assembly, wherein:
        the rotatable cover comprises a circular track within which the plurality of sliders rest when the rotatable cover assembly is attached with the chassis assembly;
        the plurality of sliders flex when pressure is applied to removably attach the chassis assembly with the circular track;
        the rotatable cover assembly is configured to be attached and removed from the chassis assembly in any rotational orientation; and
        while the rotatable cover assembly is removably attached with the plurality of cover fasteners, the rotatable cover assembly is configured to block access to the one or more compartments defined by the chassis assembly.

2. The smart home device of claim 1, wherein while the rotatable cover assembly is removably attached with the plurality of cover fasteners, the rotatable cover assembly is configured to be rotatable with respect to the chassis assembly.

3. The smart home device of claim 1, wherein the rotatable cover assembly comprises a cover body, wherein a front surface of the cover body comprises a plurality of protrusions.

4. The smart home device of claim 3, wherein the rotatable cover assembly further comprises a fabric that covers the front surface of the cover body that comprises the plurality of protrusions.

5. The smart home device of claim 1, wherein a front of the rotatable cover assembly has a visible pattern.

6. The smart home device of claim 5, wherein the front of the rotatable cover assembly that has the visible pattern comprises a fabric.

7. The smart home device of claim 1, wherein the rotatable cover assembly is circular.

8. The smart home device of claim 7, wherein the rotatable cover assembly is continuously rotatable in a clockwise and counterclockwise direction with non-indexed movement.

9. The smart home device of claim 1, wherein the chassis assembly comprises a display that is visible through a defined opening in the rotatable cover assembly while the rotatable cover assembly is removably attached with the plurality of cover fasteners.

10. The smart home device of claim 9, wherein the display is a dead front display.

11. The smart home device of claim 1, wherein the chassis assembly comprises a button that is accessible through a defined opening in the rotatable cover assembly while the rotatable cover assembly is removably attached with the plurality of cover fasteners.

12. The smart home device of claim 1, wherein the smart home device is an actuator device that is configured to be connected with a plurality of heating, ventilation, and air conditioning control wires via terminals present in a compartment of the one or more compartments.

13. A boiler control system, comprising:
an actuator device that is connected with a boiler via one or more control wires, comprising:
a chassis assembly that defines one or more compartments and the chassis assembly comprises a plurality of cover fasteners, wherein the plurality of cover fasteners comprises a plurality of sliders;
a rotatable cover assembly configured to be removably attached with the chassis assembly to at least partially cover a front of the chassis assembly, wherein:
the rotatable cover assembly comprises a circular track within which the plurality of sliders rest when the rotatable cover assembly is attached with the chassis assembly;
the plurality of sliders flex when pressure is applied to removably attach the chassis assembly with the circular track;
the rotatable cover assembly is configured to be attached and removed from the chassis assembly in any rotational orientation; and
while the rotatable cover assembly is removably attached with the plurality of cover fasteners, the rotatable cover assembly is configured to block access to the one or more compartments defined by the chassis assembly; and
a thermostat stand device that provides power to a thermostat that wirelessly communicates with the actuator device.

14. The boiler control system of claim 13, wherein while the rotatable cover assembly is removably attached with the plurality of cover fasteners, the rotatable cover assembly is configured to be rotatable with respect to the chassis assembly.

15. The boiler control system of claim 13, wherein the rotatable cover assembly comprises a cover body, wherein a front surface of the cover body comprises a plurality of protrusions.

16. The boiler control system of claim 15, wherein the rotatable cover assembly further comprises a fabric that covers the front surface of the cover body that comprises the plurality of protrusions.

17. The boiler control system of claim 13, wherein a front of the rotatable cover assembly has a visible pattern.

18. The boiler control system of claim 17, wherein the front of the rotatable cover assembly that has the visible pattern comprises a fabric.

19. The boiler control system of claim 13, wherein the rotatable cover assembly is continuously rotatable in a clockwise and counterclockwise direction with non-indexed movement.

20. The boiler control system of claim 13, wherein the chassis assembly comprises a display that is visible through a defined opening in the rotatable cover assembly while the rotatable cover assembly is removably attached with the plurality of cover fasteners.

* * * * *